(12) United States Patent
Wang et al.

(10) Patent No.: US 11,175,590 B2
(45) Date of Patent: Nov. 16, 2021

(54) LOW DOSE CHARGED PARTICLE METROLOGY SYSTEM

(71) Applicant: ASML Netherlands B.V., Veldhoven (NL)

(72) Inventors: Fei Wang, Santa Clara, CA (US); Wei Fang, Milpitas, CA (US); Kuo-Shih Liu, Fremont, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/755,127

(22) PCT Filed: Oct. 5, 2018

(86) PCT No.: PCT/EP2018/077102
§ 371 (c)(1),
(2) Date: Apr. 9, 2020

(87) PCT Pub. No.: WO2019/072704
PCT Pub. Date: Apr. 18, 2019

(65) Prior Publication Data
US 2020/0333714 A1    Oct. 22, 2020

Related U.S. Application Data

(60) Provisional application No. 62/570,624, filed on Oct. 10, 2017.

(51) Int. Cl.
*G03F 7/20* (2006.01)
*G01B 15/00* (2006.01)
(Continued)

(52) U.S. Cl.
CPC ......... *G03F 7/70625* (2013.01); *G01B 15/00* (2013.01); *H01J 37/222* (2013.01);
(Continued)

(58) Field of Classification Search
CPC .... G03F 7/70625; G01B 15/00; H01J 37/222; H01J 37/28; H01J 2237/2817; H01L 22/12
See application file for complete search history.

(56) References Cited

U.S. PATENT DOCUMENTS

| | | |
|---|---|---|
| 2004/0195507 A1 | 10/2004 | Yamaguchi et al. |
| 2009/0218491 A1 | 9/2009 | Morokuma et al. |
| 2010/0215247 A1 | 8/2010 | Kitamura et al. |

FOREIGN PATENT DOCUMENTS

| | | |
|---|---|---|
| CN | 102890089 A | 1/2013 |
| TW | 201519346 A | 5/2015 |
| TW | 201629811 A | 8/2016 |

OTHER PUBLICATIONS

International Search Report and Written Opinion issued in related PCT International Application No. PCT/EP2018/077102, dated Mar. 29, 2019 (16 pgs.).

*Primary Examiner* — Nicole M Ippolito
*Assistant Examiner* — Hanway Chang
(74) *Attorney, Agent, or Firm* — Finnegan, Henderson, Farabow, Garrett & Dunner, LLP

(57) ABSTRACT

Systems and methods for conducting critical dimension metrology are disclosed. According to certain embodiments, a charged particle beam apparatus generates a beam for imaging a first area and a second area. Measurements are acquired corresponding to a first feature in the first area, and measurements are acquired corresponding to a second feature in the second area. The first area and the second area are at separate locations on a sample. A combined measurement is calculated based on the measurements of the first feature and the measurements of the second feature.

19 Claims, 19 Drawing Sheets

(51) Int. Cl.
*H01J 37/22* (2006.01)
*H01J 37/28* (2006.01)
*H01L 21/66* (2006.01)

(52) U.S. Cl.
CPC .............. *H01J 37/28* (2013.01); *H01L 22/12* (2013.01); *H01J 2237/2817* (2013.01)

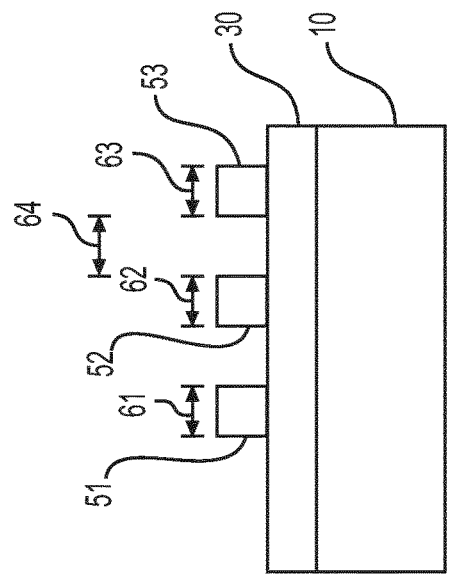
FIG. 1B
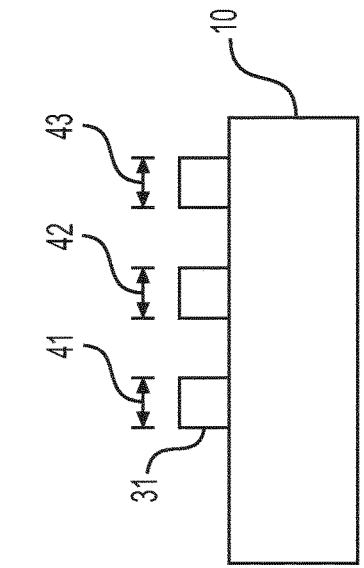
FIG. 1D
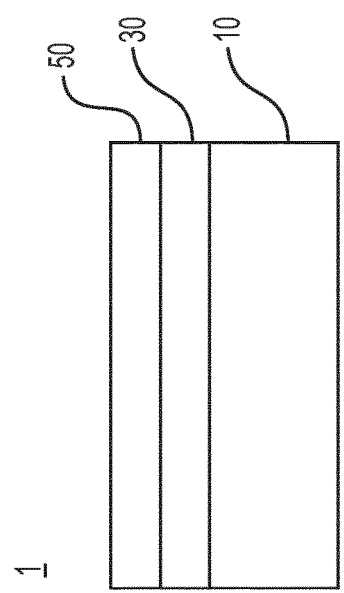
FIG. 1A
FIG. 1C

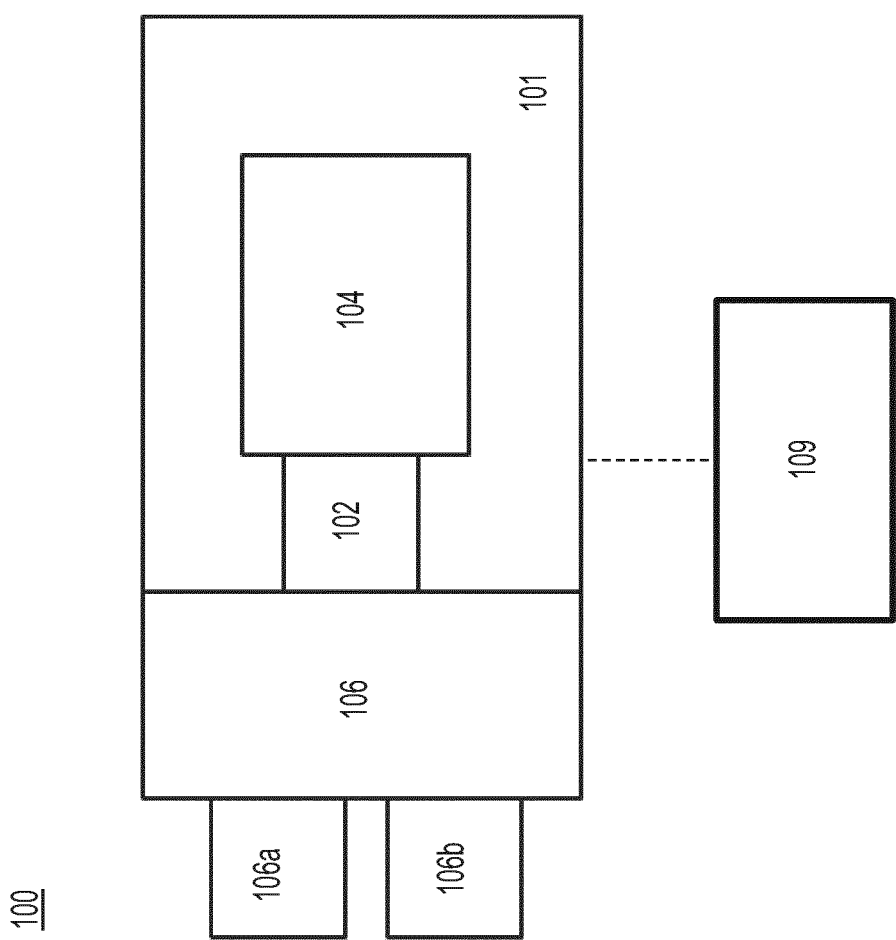

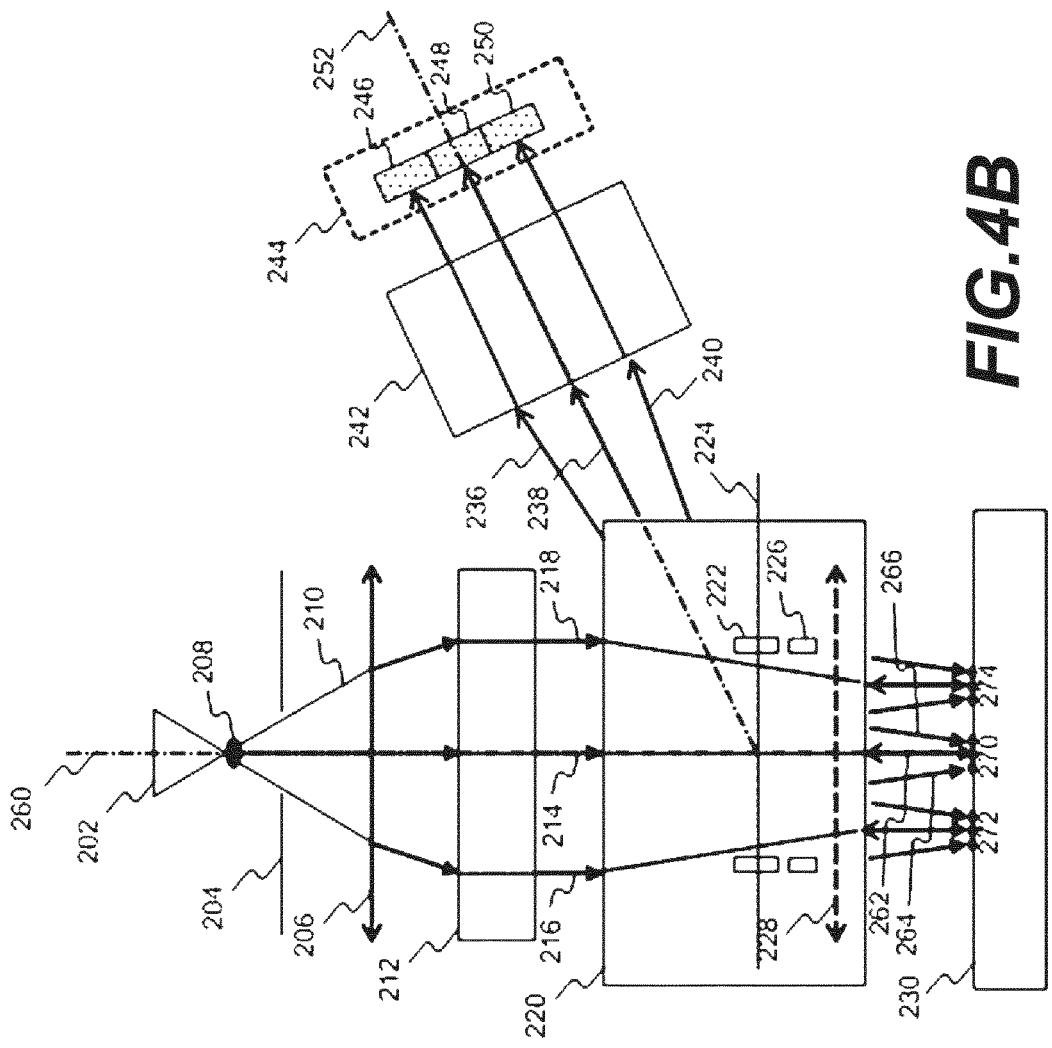

|  | RAW DATA (nm) | | | | RUN AVERAGE | DIFFERENT TO RUN AVERAGE (nm) | | | |
| --- | --- | --- | --- | --- | --- | --- | --- | --- | --- |
|  | DIE#1 | DIE#2 | DIE#3 | DIE#4 |  | DIE#1 | DIE#2 | DIE#3 | DIE#4 |
| RUN1 | 34.27 | 33.56 | 34.22 | 34.15 | 34.05 | 0.22 | -0.49 | 0.17 | 0.10 |
| RUN2 | 36.25 | 35.49 | 36.21 | 36.17 | 36.03 | 0.22 | -0.54 | 0.18 | 0.14 |
| RUN3 | 36.28 | 35.63 | 36.41 | 36.28 | 36.15 | 0.13 | -0.52 | 0.26 | 0.13 |
| RUN4 | 36.23 | 35.49 | 36.17 | 36.12 | 36.00 | 0.23 | -0.51 | 0.17 | 0.12 |
| RUN5 | 35.90 | 35.18 | 35.89 | 35.83 | 35.70 | 0.20 | -0.52 | 0.19 | 0.13 |
| RUN6 | 35.59 | 34.88 | 35.55 | 35.47 | 35.37 | 0.22 | -0.49 | 0.18 | 0.10 |
| RUN7 | 35.23 | 34.50 | 35.20 | 35.14 | 35.02 | 0.21 | -0.51 | 0.19 | 0.12 |
| RUN8 | 34.82 | 34.21 | 34.86 | 34.73 | 34.66 | 0.17 | -0.45 | 0.20 | 0.08 |
| RUN9 | 34.38 | 33.77 | 34.35 | 34.34 | 34.21 | 0.17 | -0.44 | 0.14 | 0.13 |
| RUN10 | 34.01 | 33.23 | 33.90 | 33.89 | 33.76 | 0.25 | -0.53 | 0.14 | 0.13 |
|  |  |  |  |  |  | 0.11 | 0.10 | 0.10 | 0.06 |
|  |  |  |  |  | 3σ (nm) | 0.093 | | | |
|  |  |  |  |  | PRECISION (nm) | | | | |

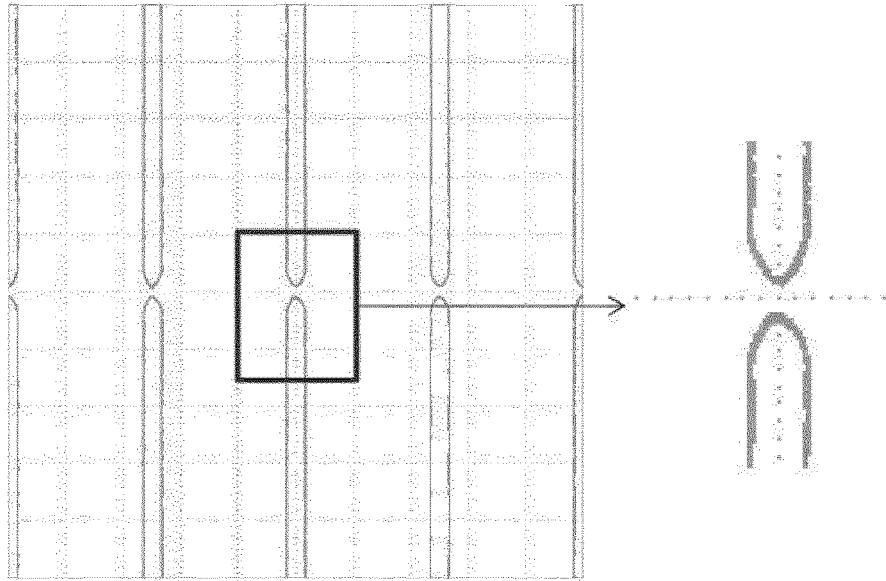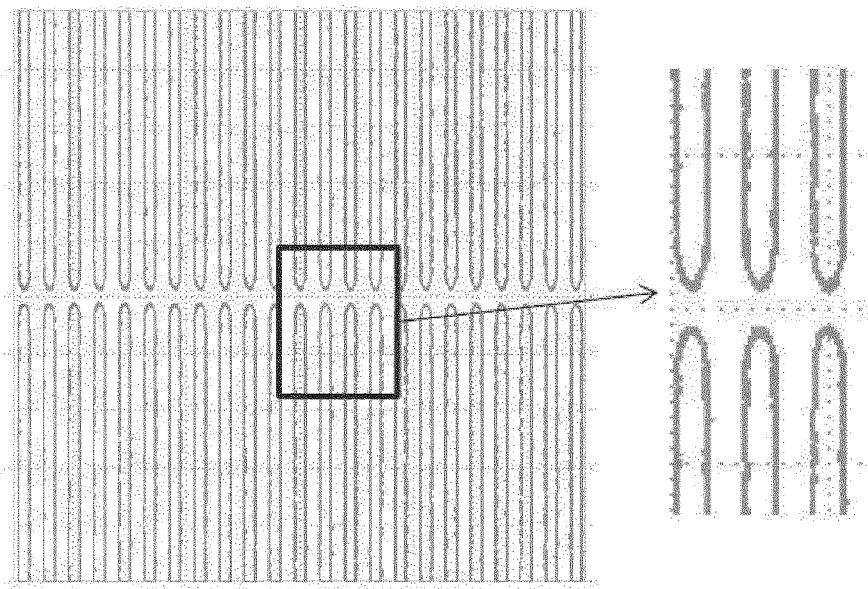
FIG. 13

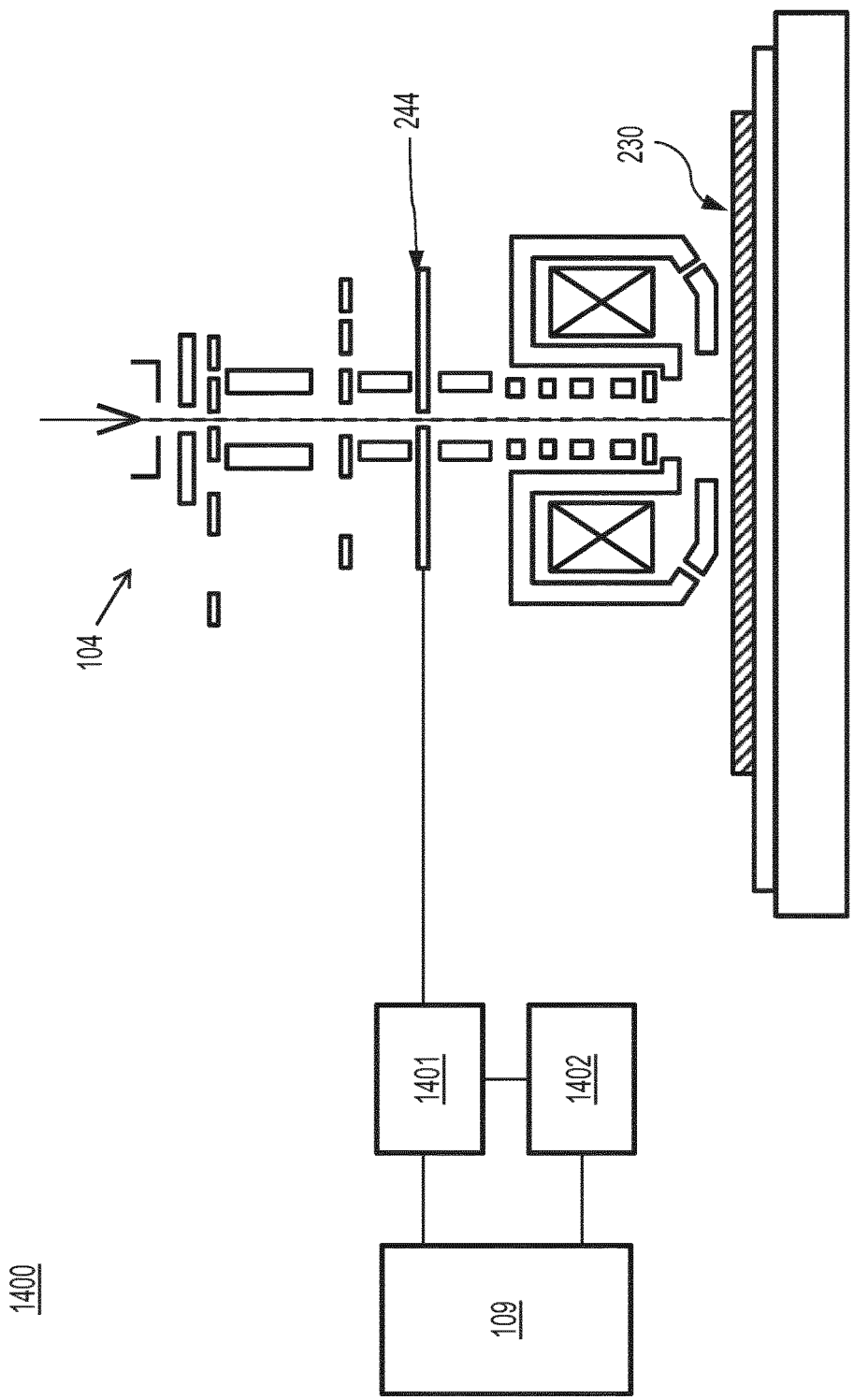

LOW DOSE CHARGED PARTICLE METROLOGY SYSTEM

CROSS-REFERENCE TO RELATED APPLICATIONS

This application claims priority to International Application No. PCT/EP2018/077102, filed Oct. 5, 2018, and published as WO 2019/072704 A1, which claims priority of U.S. application 62/570,624 which was filed on Oct. 10, 2017. The contents of these applications are incorporated herein by reference in their entireties.

TECHNICAL FIELD

The present disclosure generally relates to the field of charged particle beam imaging, and more particularly, to systems and methods for charged particle metrology.

BACKGROUND

Charged particle beam metrology systems may be used in process control for some semiconductor manufacturing processes. For example, a critical dimension scanning electron microscope (CD SEM) may be used as a dedicated system for measuring the dimensions of fine patterns formed on a semiconductor wafer. High accuracy and high precision are necessary to determine whether a particular CD SEM may be appropriate for controlling a specific process. High resolution SEM tools have been established as the standard for direct critical dimension measurements in many advanced semiconductor manufacturing processes.

However, the bombardment of energetic particles as used in an SEM tool on sensitive materials on a wafer surface, such as photoresists used in lithographic patterning, can have a negative effect on measurements. For example, bombardment of electrons on electron sensitive materials may damage the target topography and introduce measurement uncertainty. In some techniques, the fundamental precision of SEM metrology should be, for example, about 0.1 nm in order to quantify the quality of features expressed in SEM images. However, measurement uncertainty introduced by electron impingement can be on the order of process stochastics, which may be, for example, about 0.5 nm to 4 nm. Thus, damage-induced uncertainty may be larger than the process precision limit.

Furthermore, damage-induced uncertainty can be pattern dependent. That is, the amount of damage-induced uncertainty may be dependent on the density and topography of local patterns. Thus, two-dimensional classical CD SEM based measurements may be an unreliable metrology technology for some applications such as critical photo resist measurements.

Related art systems may use imaging conditions with electron landing energy of, for example, 1 keV in order to reduce sample damage. However, a trade-off relationship exists between electron energy dosage and signal to noise ratio (SNR). For example, lowering the landing energy may yield an SEM image of insufficient quality for conducting measurements. Therefore, related art systems face a limitation in that landing energy cannot be reduced without a corresponding drop in image precision. Further improvements in the art are desired.

SUMMARY

Embodiments of the present disclosure provide systems and methods for charged particle imaging and measurement. In some embodiments, a charged particle system is provided. The charged particle system may include a charged particle beam apparatus configured to generate a charged particle beam.

In some embodiments, a metrology system comprises a charged particle beam apparatus, a controller, and a storage. The controller may be configured to acquire a plurality of images of a sample based on the charged particle beam and store the plurality of images in the storage. The controller may also be configured to acquire a first plurality of measurements associated with a first feature of the sample, acquire a second plurality of measurements associated with a second feature of the sample, where the second feature is at a separate location on the sample from the first feature, and calculate a combined measurement based on the first plurality of measurements and the second plurality of measurements.

According to some embodiments, an arrangement can be achieved that eliminates a trade-off relationship between charged particle dosage and measurement precision. A charged particle detection system can be provided such that it can achieve a reduced dosage, high flexibility, and without corresponding deterioration in precision and damage to the sample.

Additional objects and advantages of the disclosed embodiments will be set forth in part in the following description, and in part will be apparent from the description, or may be learned by practice of the embodiments. Objects and advantages of the disclosed embodiments may be realized and attained by the elements and combinations set forth in the claims. However, exemplary embodiments of the present disclosure are not necessarily required to achieve such exemplary objects and advantages, and some embodiments may not achieve any of the stated objects and advantages.

It is to be understood that both the foregoing general description and the following detailed description are exemplary and explanatory only and are not restrictive of the disclosed embodiments, as claimed.

BRIEF DESCRIPTION OF THE DRAWINGS

FIGS. 1A-1D are diagrams illustrating a cross sectional view of a wafer, consistent with embodiments of the present disclosure.

FIG. 3 is a schematic diagram illustrating an exemplary electron beam inspection (EBI) system, consistent with embodiments of the present disclosure.

FIGS. 4A and 4B are diagrams illustrating exemplary electron beam tools that can be part of the exemplary electron beam inspection system of FIG. 3, consistent with embodiments of the present disclosure.

FIG. 6 is a table showing exemplary measurement data, consistent with embodiments of the present disclosure.

FIG. 7 shows tables of exemplary measurement data, consistent with embodiments of the present disclosure.

FIG. 13 is a diagram illustrating an exemplary contour stacking procedure for two-dimensional features, consistent with embodiments of the present disclosure FIG. 14 is a diagram illustrating an exemplary critical dimension metrology system, consistent with embodiments of the present disclosure.

DESCRIPTION OF EMBODIMENTS

Figure 2A:
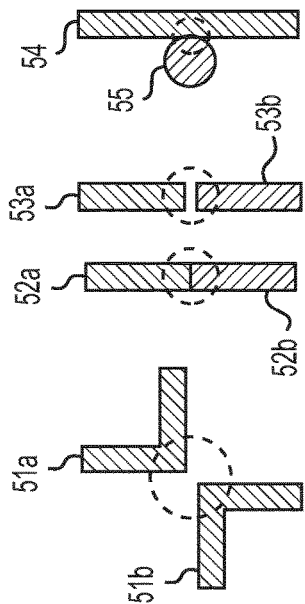
FIGS. 2A and 2B are diagrams illustrating exemplary patterns for measurement, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses, systems, and methods consistent with aspects related to the subject matter as recited in the appended claims. For example, although some embodiments are described in the context of utilizing electron beams, the disclosure is not so limited. Other types of charged particle beams can be similarly applied.

Embodiments of the present disclosure may provide a charged particle system that may be useful for charged particle metrology. The charged particle system may be applicable for critical dimension measurements.

In some exemplary embodiments, electron sensitive materials are used in semiconductor processing, such as a photo resist. Metrology may comprise conducting measurements of a photo resist pattern after exposure and development, for example, in after-development-inspection (ADI). As shown in FIG. 1A, a semiconductor device 1 may comprise a substrate 10 having a thin film layer 30 formed thereon. Thin film layer 30 may be a precursor to a wiring layer. Thin film layer 30 may have a photo resist layer 50 formed thereon. After patterning and development, photo resist layer 30 may be reduced to photo resist portion 51, photo resist portion 52, and photo resist portion 53, as shown in FIG. 1B.

After developing photo resist layer 30, etching may be performed to reduce thin film layer 30 to wiring portion 31, wiring portion 32, and wiring portion 33, as shown in FIG. 1C. Metrology may also comprise conducting measurements of a wiring pattern after etching processing, for example, in after-etch-inspection (AEI).

In some embodiments, metrology may be performed by measuring photo resist portions, for example, taking a measurement 61, measurement 62, and measurement 63, as shown in FIG. 1B. Additionally, critical dimension measurement may comprise measuring a width of a pattern, such as measurement 61, or an edge-to-edge distance between patterned features, such as measurement 64, for example.

Photo resist materials may be sensitive to electron bombardment, which may affect their shape. Photo resist shrinkage is strongly correlated to landing energy and dosage of the incoming electron bombardment. In some cases, the width of a photo resist pattern may shrink by approximately 1 to 4% of its size due to electron bombardment. For example, in an exemplary pattern of 54 nm wide photo resist lines, when a 300 eV beam is used on a sample, the photo resist may experience shrinkage of 0.54 to 2.01 nm. Additionally, when a 500 eV beam is used on the sample, the photo resist may experience a shrinkage of 0.48 to 2.68 nm.

Figure 2B:
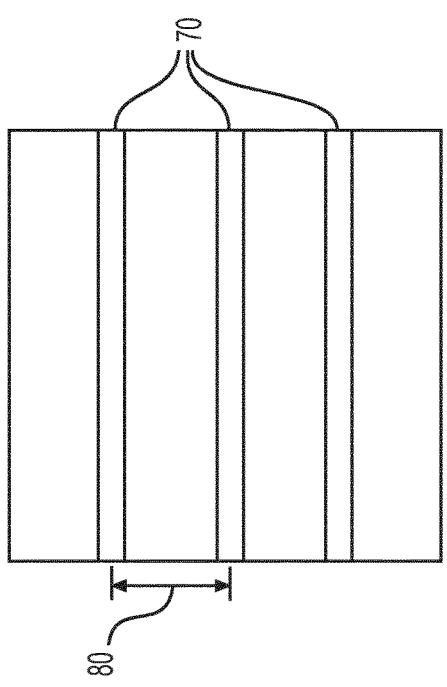

FIG. 2A illustrates an exemplary pattern of photo resist lines 70 having a standard width of 54 nm. A pitch 80 may be defined as a center-to-center separation of the repeating pattern of lines 70. Critical dimension metrology of such a sample may comprise conducting leading-edge measurements, one-dimensional length measurements of a line-space pattern, and the like. Critical dimension metrology may also be applied to features having other shapes, such as corners of traces 51a, 51b, connection between traces 52a, 52b, pitch of traces 53a, 53b, and connection between trace 54 and electrode 55, as shown in FIG. 2B, for example.

Figure 2C:
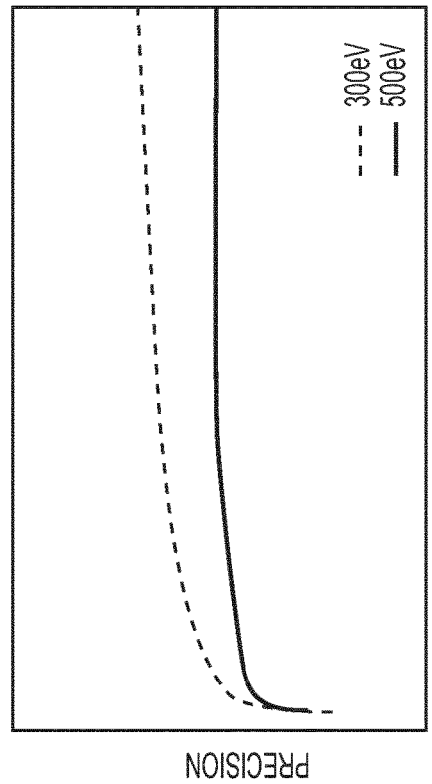
FIGS. 2C and 2D are diagrams illustrating exemplary relationships of behavior of electron sensitive materials, consistent with embodiments of the present disclosure.

FIG. 2C illustrates a relationship of photo resist shrinkage as affected by various parameters. As shown in FIG. 2C, higher beam energy corresponds to larger shrinkage. FIG. 2C also demonstrates that photo resist shrinkage may be pattern-dependent. For example, as pitch increases, shrinkage also increases.

Figure 2D:
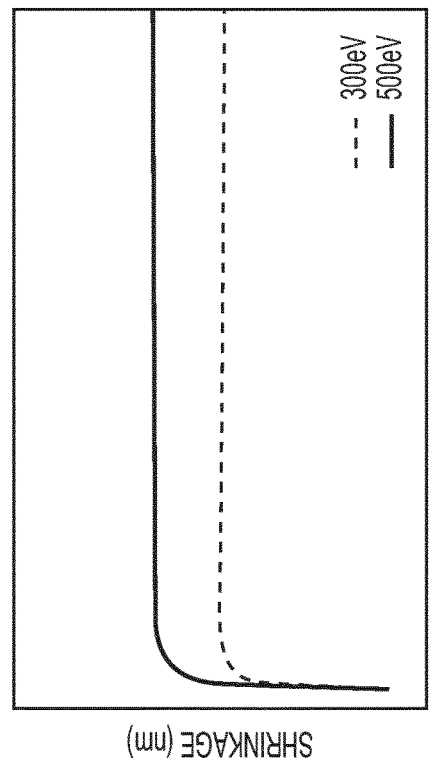

FIG. 2D illustrates a relationship of measurement precision as affected by various parameters. A lower numerical value of precision is desirable. As shown in FIG. 2D, using higher beam energy may result in better precision. On the other hand, using lower beam energy may result in a deterioration of precision. However, as mentioned above, using higher beam energy also results in photo resist shrinkage. Thus, metrology of electron sensitive materials involves counteracting effects.

Additionally, repeated scanning of the same area can have a negative impact on the measured pattern. For example, in some techniques, frame averaging may be used. In a frame averaging technique, multiple images of the same area are captured and measurements are averaged across the total number of frames. An exemplary comparative frame averaging method may use the following experimental conditions. Landing energy: 300 eV. Scan rate: 14 MHz. Beam current: 8 pA. Number of frames: 16. Pixel size: 0.66 nm.

A measure of dosage may be estimated as electrons per nm-sq, which may be determined by the following equation:

$$\text{electrons per nm-}sq = \frac{\text{beam current} \times \text{dwell time} \times \text{frames}}{\text{electron charge} \times \text{pixel size}^2} \quad (1)$$

Thus, in an exemplary comparative frame averaging method, a value of electrons per nm-sq may be approximately 130.

A value of precision may be represented by $3 \times \sigma$ of measurement width. That is, three times a standard deviation of the measured width values. In some embodiments the precision may represent measurement repeatability of a CD SEM tool.

Frame averaging may be useful for enhancing precision since multiple measurements can be taken and compared, thus increasing confidence in the feature measurement.

However, repeated scanning may result in increased incident electron dosage, and may result in increased damage to the sample.

In some other embodiments precision may refer to the closeness of a plurality of measurements to each other. Due to the nature of SEM imaging, reduced dosage of incident electrons on a sample imaging surface may result in inferior image quality and low SNR. Thus, measurements taken at a low dosage may have some degree of measurement uncertainty. Increasing the dosage may be one way to reduce measurement uncertainty because a better-quality image can be produced. Measured values based on higher dose images may seem more reliable. However, as discussed above, electron bombardment can cause the sample to change. Thus, measurements taken at higher dosages may not necessarily lead to superior precision because the values measured at earlier frames reflect the shape of the sample before damage has occurred. That is, with high dosage and multiple scanning of the same imaging area, the dimensions of the sample may change over the course of the measurement process.

In some exemplary embodiments, to minimize the impact of high energy electron bombardment, individual frame-averaging images can be used from different points on a sample surface. Based on an assumption that a pattern of interest may be repeated at different points on the sample, and that corresponding environments remain consistent at different measurement points, a technique can be applied where measurement precision is enhanced while damage to the sample is minimized.

For example, in an exemplary method, measurement conditions may be used such that a low electron dosage is applied to a sample. When electron dosage is low, precision may be limited. Thus, to recover precision, image averaging can be conducted over a plurality of images at different locations on the sample, thus increasing the number of measurements of corresponding patterns while minimizing sample damage and preserving the sample surface topology.

For example, a comparative frame averaging process may comprise scanning a location 16 times. In an exemplary embodiment, four different locations can be used. A single location may be scanned only four times and can be averaged to obtain precision similar to the comparative frame averaging process.

In an exemplary embodiment, a plurality of different locations may comprise corresponding patterns. Location data to identify the plurality of different locations may be based on user input, wafer design, image analysis, and the like. For example, a wafer can be designed to have identical regions in different locations for the purpose of conducting image averaging. Location data may be based on designs of the wafer, such as GDS (Graphic Data System) or OASIS (Open Artwork System Interchange Standard) designs. The regions may be, for example, calibration standard patterns. The regions can also be functional patterns. Alternatively, regions having corresponding geometries can be selected after a wafer has already been designed or constructed. Corresponding locations may be fabricated under the same process conditions. Imaging may be conducted under low dosage conditions at the plurality of different locations. Then, an algorithm may average measurement data collected at the plurality of different locations.

While the term identical is used to describe corresponding patterns in some exemplary embodiments, it is understood that corresponding patterns at different locations on a wafer may have some variation due to manufacturing stochastics. Thus, identical patterns may be interpreted to mean patterns having substantially the same geometry.

Reference is now made to FIG. 3, which illustrates an exemplary electron beam inspection (EBI) system 100 consistent with embodiments of the present disclosure. As shown in FIG. 3, EBI system 100 includes a main chamber 101 a load/lock chamber 102, an electron beam tool 104, and an equipment front end module (EFEM) 106. Electron beam tool 104 is located within main chamber 101. EFEM 106 includes a first loading port 106a and a second loading port 106b. EFEM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples may be collectively referred to as "wafers" hereafter).

One or more robot arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robot arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104. Electron beam tool 104 may be a single-beam system or a multi-beam system. A controller 109 is electronically connected to the electron beam tool 104. The controller 109 may be a computer configured to execute various controls of the EBI system.

Conducting critical dimension metrology may comprise subjecting a wafer to inspection a plurality of times. For example, the wafer may undergo a load/unload procedure a plurality of times to collect measurement data from a plurality of runs.

Figure 4A:
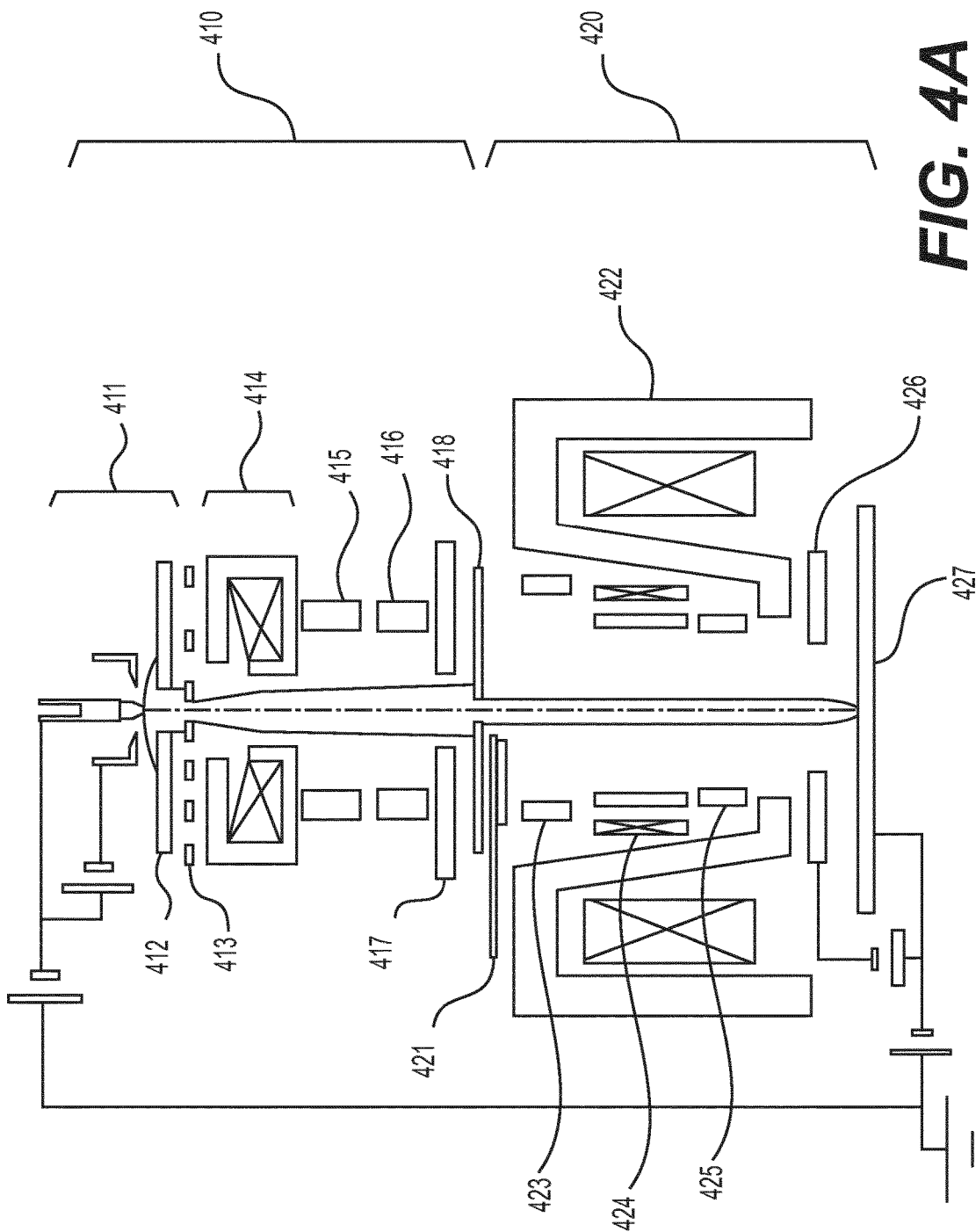

FIG. 4A illustrates an electron beam tool 104 that may be configured for use in EBI system 100. Electron beam tool 104 may be a single beam apparatus, as shown in FIG. 4A, or a multi-beam apparatus.

As shown in FIG. 4A, an electron beam tool 104 may comprise an electron gun portion 410 and an electron column portion 420. Electron gun portion 410 may comprise a cathode 411, a gun aperture 412, a movable strip aperture 413, a condenser lens 414, a beam blanker 415, an astigmatism corrector 416, a gate valve 417, and an objective aperture 418. Electron column portion 420 may comprise a first detector 421, a magnetic lens 422, a second detector 423, a Wien filter 424, a third detector 425, an objective electrode 426, and a wafer plane 427.

Reference is now made to FIG. 4B, which illustrates an electron beam tool 104 (also referred to herein as apparatus 104) that may be configured for use in a multi-beam image (MBI) system. Electron beam tool 104 comprises an electron source 202, a gun aperture 204, a condenser lens 206, a primary electron beam 210 emitted from electron source 202, a source conversion unit 212, a plurality of beamlets 214, 216, and 218 of primary electron beam 210, a primary projection optical system 220, a wafer stage (not shown in FIG. 4B), multiple secondary electron beams 236, 238, and 240, a secondary optical system 242, and an electron detection device 244. Primary projection optical system 220 can comprise a beam separator 222, deflection scanning unit 226, and objective lens 228. Electron detection device 244 can comprise detection sub-regions 246, 248, and 250.

Electron source 202, gun aperture 204, condenser lens 206, source conversion unit 212, beam separator 222, deflection scanning unit 226, and objective lens 228 can be aligned with a primary optical axis 260 of apparatus 104. Secondary optical system 242 and electron detection device 244 can be aligned with a secondary optical axis 252 of apparatus 104.

Electron source 202 can comprise a cathode, an extractor or an anode, wherein primary electrons can be emitted from the cathode and extracted or accelerated to form a primary electron beam 210 with a crossover (virtual or real) 208. Primary electron beam 210 can be visualized as being emitted from crossover 208. Gun aperture 204 can block off peripheral electrons of primary electron beam 210 to reduce Coulomb effect. The Coulomb effect can cause an increase in size of probe spots.

Source conversion unit 212 can comprise an array of image-forming elements (not shown in FIG. 4B) and an array of beam-limit apertures (not shown in FIG. 4B). The array of image-forming elements can comprise an array of micro-deflectors or micro-lenses. The array of image-forming elements can form a plurality of parallel images (virtual or real) of crossover 208 with a plurality of beamlets 214, 216, and 218 of primary electron beam 210. The array of beam-limit apertures can limit the plurality of beamlets 214, 216, and 218.

Condenser lens 206 can focus primary electron beam 210. The electric currents of beamlets 214, 216, and 218 downstream of source conversion unit 212 can be varied by adjusting the focusing power of condenser lens 206 or by changing the radial sizes of the corresponding beam-limit apertures within the array of beam-limit apertures. Objective lens 228 can focus beamlets 214, 216, and 218 onto a wafer 230 for inspection and can form a plurality of probe spots 270, 272, and 274 on surface of wafer 230.

Beam separator 222 can be a beam separator of Wien filter type generating an electrostatic dipole field and a magnetic dipole field. In some embodiments, if they are applied, the force exerted by electrostatic dipole field on an electron of beamlets 214, 216, and 218 can be equal in magnitude and opposite in direction to the force exerted on the electron by magnetic dipole field. Beamlets 214, 216, and 218 can therefore pass straight through beam separator 222 with zero deflection angle. However, the total dispersion of beamlets 214, 216, and 218 generated by beam separator 222 can also be non-zero. Beam separator 222 can separate secondary electron beams 236, 238, and 240 from beamlets 214, 216, and 218 and direct secondary electron beams 236, 238, and 240 towards secondary optical system 242.

Deflection scanning unit 226 can deflect beamlets 214, 216, and 218 to scan probe spots 270, 272, and 274 over a surface area of wafer 230. In response to incidence of beamlets 214, 216, and 218 at probe spots 270, 272, and 274, secondary electron beams 236, 238, and 240 can be emitted from wafer 230. Secondary electron beams 236, 238, and 240 can comprise electrons with a distribution of energies including secondary electrons (energies ≤50 eV) and backscattered electrons (energies between 50 eV and landing energies of beamlets 214, 216, and 218). Secondary optical system 242 can focus secondary electron beams 236, 238, and 240 onto detection sub-regions 246, 248, and 250 of electron detection device 244. Detection sub-regions 246, 248, and 250 may be configured to detect corresponding secondary electron beams 236, 238, and 240 and generate corresponding signals used to reconstruct an image of surface area of wafer 230.

Reference will now be made to an exemplary image averaging process.

Figure 5A:
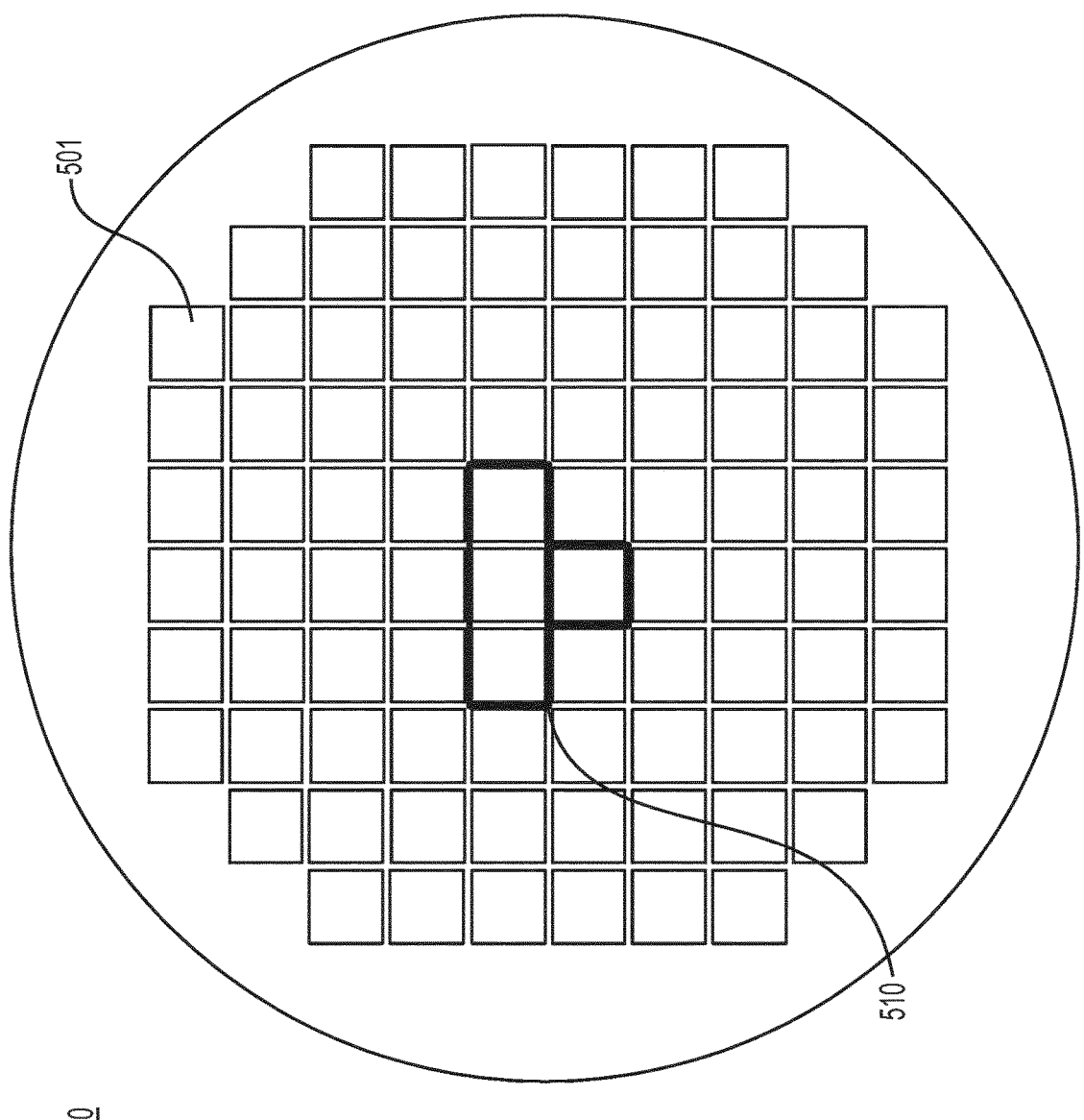
FIGS. 5A-5F are diagrams illustrating various views of a wafer, consistent with embodiments of the present disclosure.
Figure 5B:
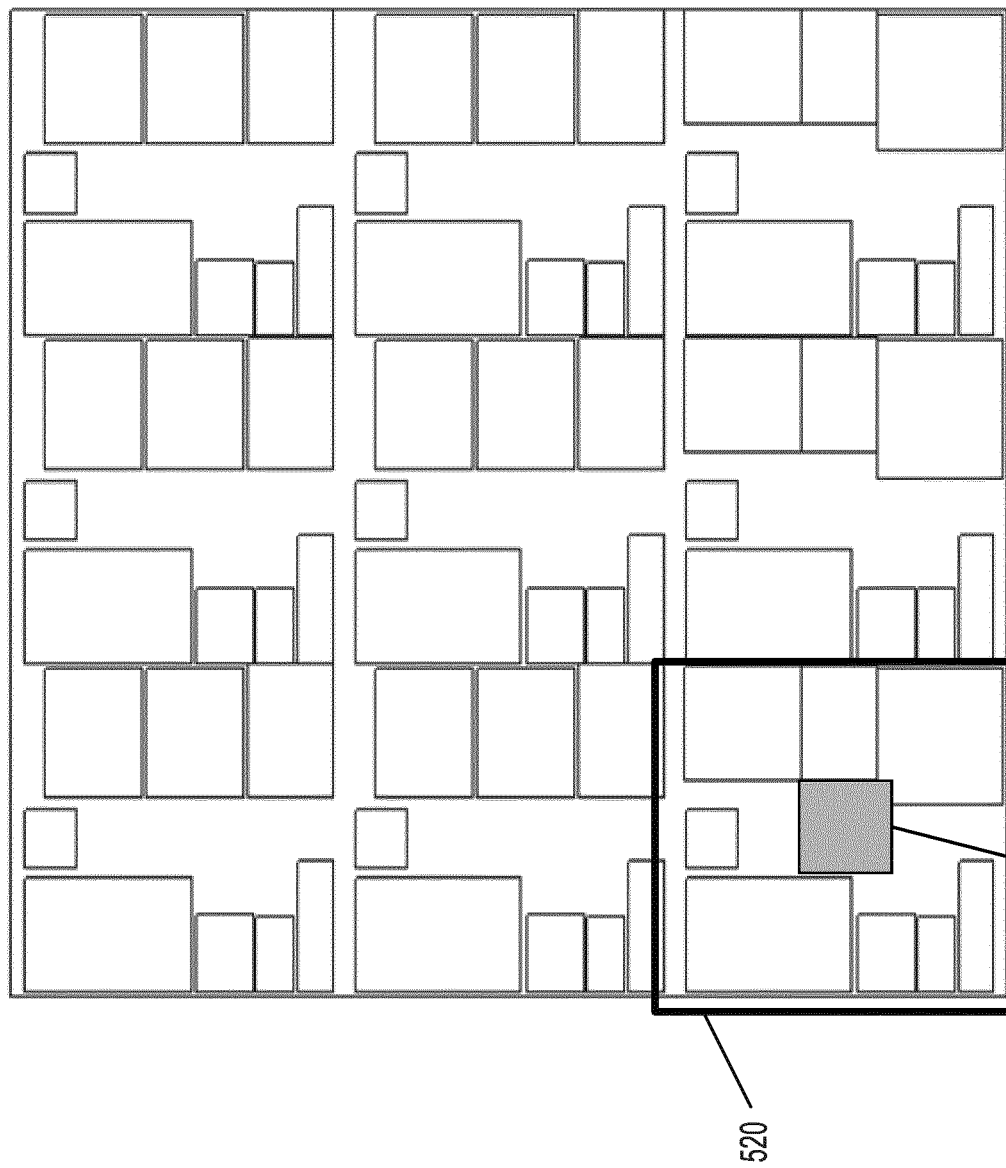

FIG. 5A depicts an exemplary wafer 500. Wafer 500 may be an electron sensitive wafer such as a negative tone development deep ultra-violet after development inspection (NTD DUV ADI) wafer. Wafer 500 comprises a plurality of dies 501. In an embodiment, a selection of four dies 510 may be taken for averaging. In one of the selected dies, there may be provided a field map 511, as shown in FIG. 5B. In field map 511, a test field 520 can be selected. Test field 520 comprises a test area 521.

Figure 5D:
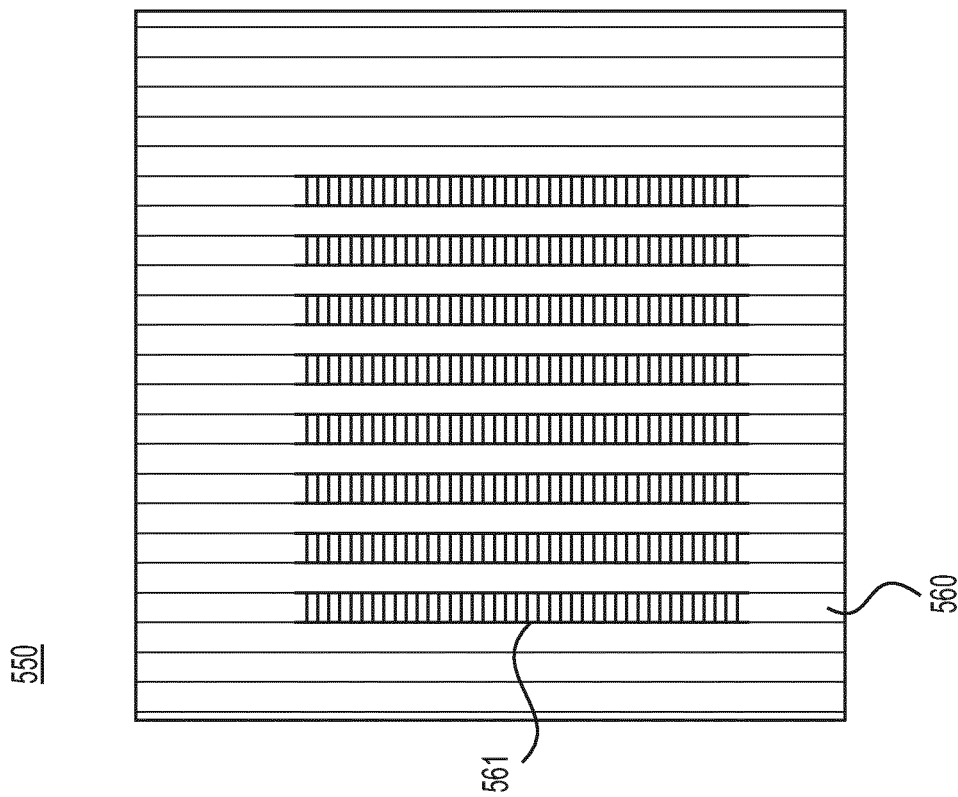
Figure 5C:
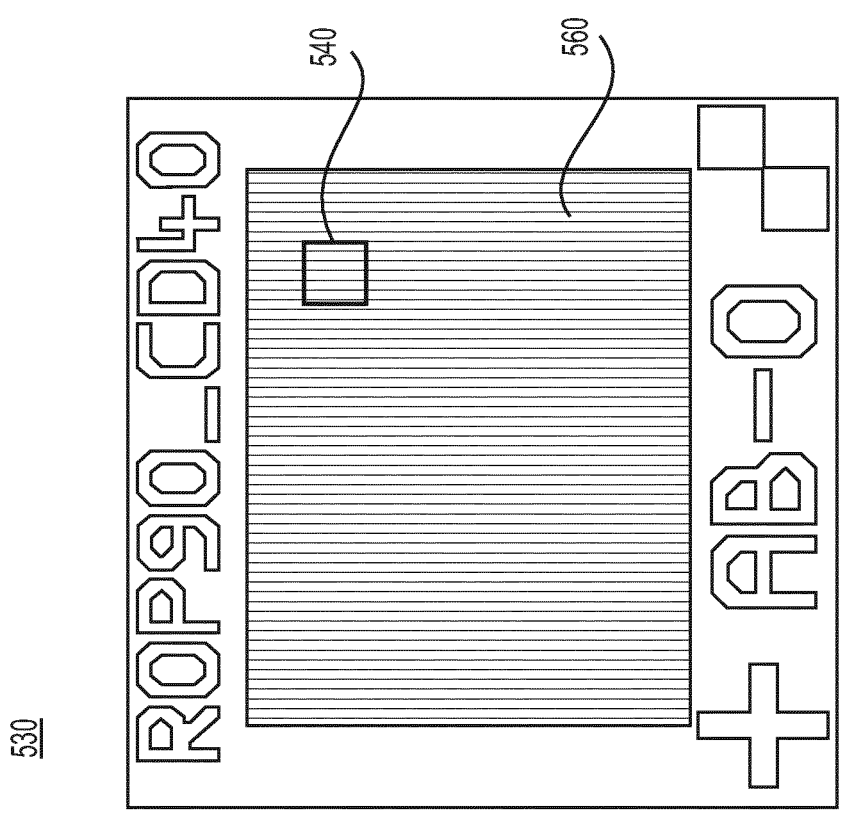

Test area 521 may be a test key 530, as shown in FIG. 5C. A plurality of lines 560 may be provided may be provided in test key 530. Test key may be specified as a line-space pattern of CD40P90. That is, a standard critical dimension of line width is 40 nm and pitch of the lines is 90 nm. Test area 521 comprises an imaging area 540, as shown in FIG. 5D. In an imaging process, an image 550 may be captured under the following conditions. For example, field of view (FOV): 1 μm. Pixel size: 1 nm. In a measuring process, critical dimensions may be measured using an H-marker 561 superimposed on image 550. In one example, 320 H-markers are used in one image and a critical dimension is calculated by averaging individual measurements.

A better understanding of the present disclosure may be obtained through the following examples, which are set forth to illustrate but are not to be construed as limiting, the present disclosure.

In a first example (example 1), a single imaging area is used for collecting measurements in one die. Critical dimension metrology may be conducted by capturing images in four dies and averaging the measured values. A precision value can be obtained by performing a load/unload operation ten times and conducting ten runs of imaging. In each die, four frames of the same imaging area are imaged, and frame averaging can be employed to output a measurement value. Thus, when frame averaging is used, a raw data point for each run may be represented by an averaged measurement value. In example 1, a primary beam current of 250 pA is used. A critical dimension can be calculated as $CD_1$, which represents critical dimension measurements taken for a single image. Measurement conditions are summarized in Table 1, where IP indicates primary beam current, and where shrinkage is assumed to be linearly proportional to electron dosage.

TABLE 1

| Example | 1 | 2 | 3 |
|---|---|---|---|
| IP [nA] | 0.25 | 0.25 | 0.125 |
| Dwell [ns] | 10 | 10 | 10 |
| Frame | 4 | 2 | 1 |
| Electron charge | 1.60E−19 | 1.60E−19 | 1.60E−19 |
| Pixel size [nm] | 1 | 1 | 1 |
| # of electrons per nm-sq | 63 | 31 | 8 |
| Dosage % to POR | 100.0% | 50.0% | 12.5% |
| Estimated PR shrinkage | 0.5~2 nm | 0.25~1 nm | 0.125~0.5 nm |

Exemplary measurement data output for example 1 is shown in the table of FIG. 6. Data may be created by an exemplary data processing method as follows. For example, in a first step, CD raw data is collected. CD raw data may include raw data measurements from acquired images. In FIG. 6, CD raw data are expressed as numerical measurement values in columns labeled Die #1, Die #2, Die #3, Die #4 under the heading Raw Data (nm). Since frame averaging is used, the numerical values of CD raw data are averages across the 4 different frames. Next, the average of each run is calculated. In FIG. 6, run average is expressed in the column labeled Run Average. Next, the difference between each raw data measurement and the respective run average is calculated. In FIG. 6, difference values are expressed as numerical values in columns labeled Die #1, Die #2, Die #3, Die #4 under the heading Difference to Run Average (nm). Next, a precision value (three times standard deviation) is calculated for each die across the ten runs. Finally, overall precision is calculated by taking the root mean square (RMS) of the individual precision values for each die.

In example 1, since electron dosage is relatively high, a good quality image with high SNR can be obtained. Furthermore, precision is under 0.1 nm and may be considered satisfactory.

Figure 5F:
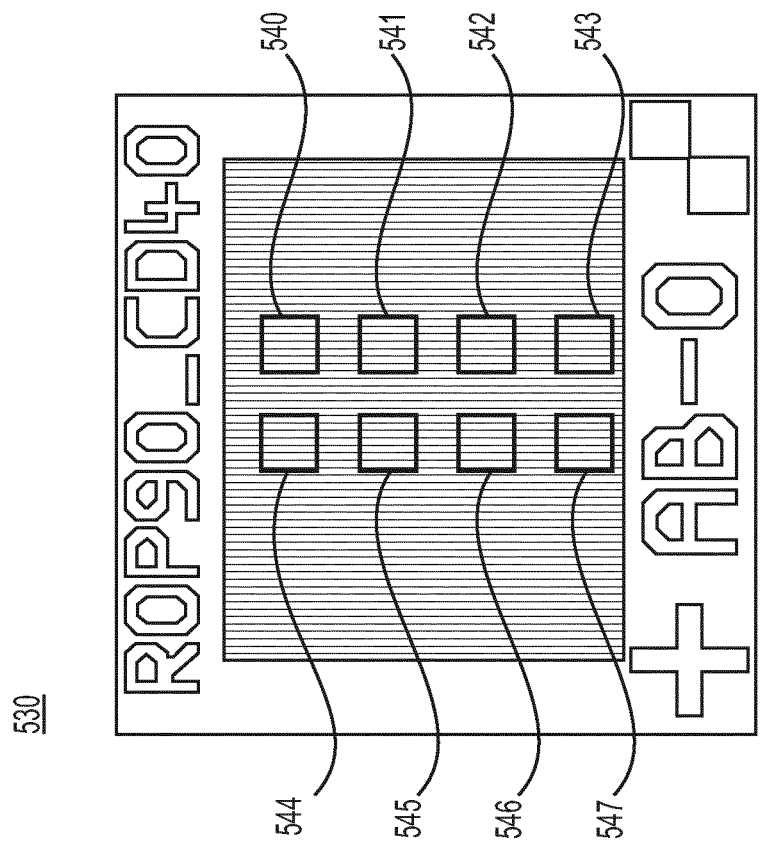
Figure 5E:
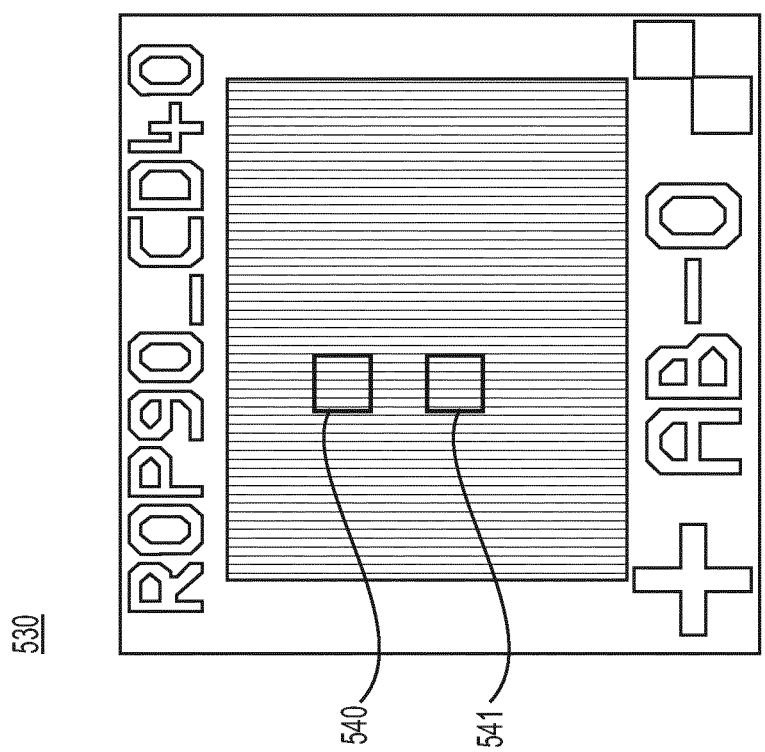

In a second example (example 2), two imaging areas are used for collecting measurements in one die. For example, as shown in FIG. 5E, there may be provided an imaging area 540 and an imaging area 541. Critical dimension metrology may be conducted by capturing images in four dies and averaging the measured values. Precision values can be obtained by performing a load/unload operation ten times and conducting ten runs of imaging. In each die, two frames of the same imaging area are imaged, and frame averaging can be employed to output corresponding measurement values. When frame averaging is used, a raw data point for each run may be represented by an averaged measurement value. In example 2, a primary beam current of 250 pA is used. However, since only two frames are taken, total electron dosage on respective imaging areas is reduced relative to example 1. A critical dimension can be calculated as an average of $CD_1$ and $CD_2$, where $CD_1$ represents critical dimension measurements taken for a first image and $CD_2$ represents critical dimension measurements taken for a second image. Measurement conditions are summarized in Table 1. Exemplary measurement data output is shown in the tables of FIG. 7.

Figure 7:
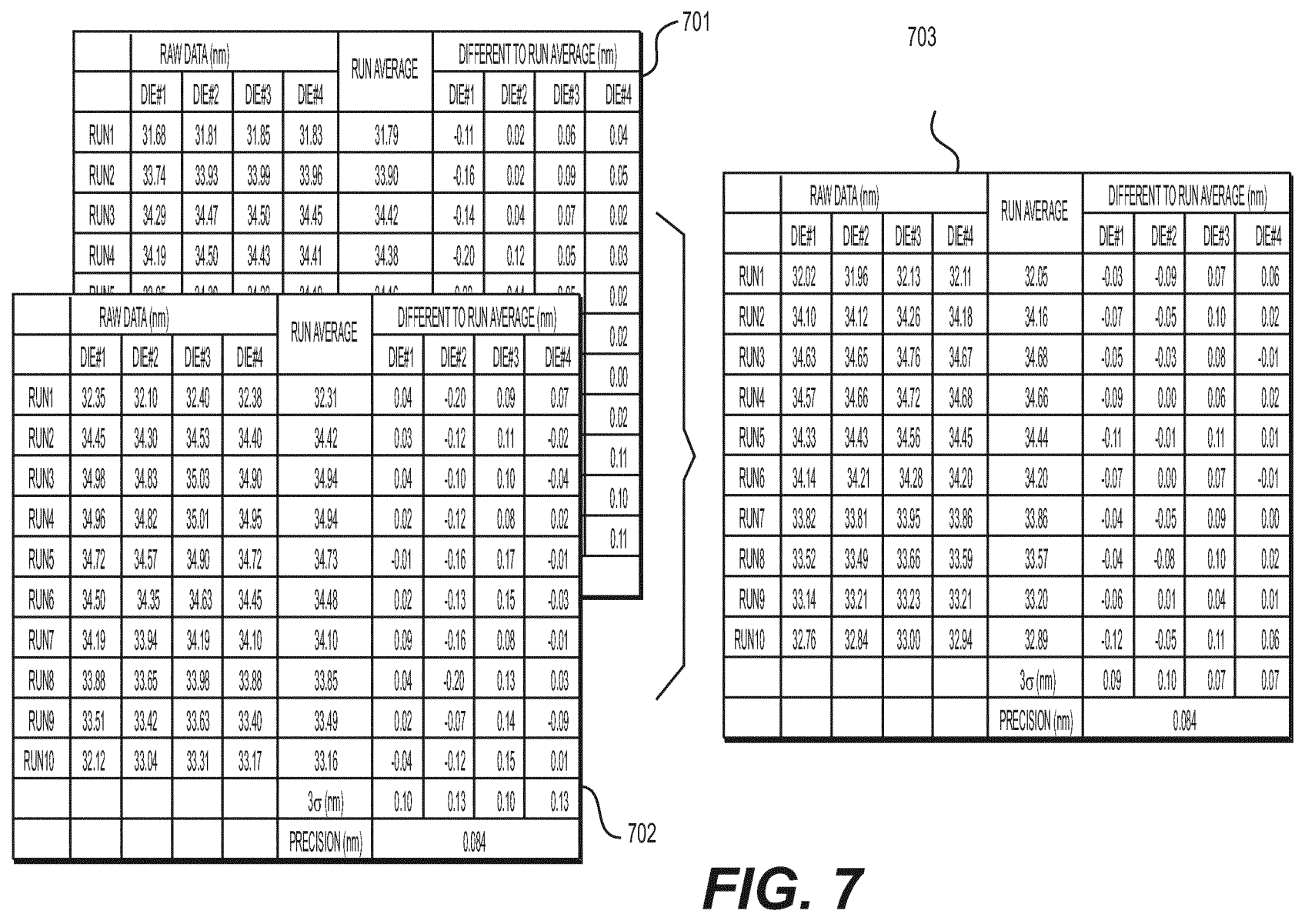

As shown in FIG. 7, there may be provided measurement data 701 corresponding to the first image, and measurement data 702 corresponding to the second image. While electron beam current is the same as example 1, each image is scanned only two times, therefore, total electron dosage is less than that of example 1. Image quality may be relatively degraded compared to example 1. Furthermore, precision values in each of measurement data 701 and measurement data 702 may be larger than that of example 1. However, measurement data 701 and measurement data 702 can be combined to yield measurement data 703. Measurement data 703 comprises a plurality of data points each based on measurements from both the first image and the second image. In particular, measurement data 703 may comprise averaged raw data values. Each data point under the Raw Data (nm) heading of measurement data 703 may comprise an average of $CD_1$ and $CD_2$. For example, raw data entry for run 1, die #1 of measurement data 701 can be averaged with raw data entry for run 1, die #1 of measurement data 702. As a result, precision can be recovered.

In a third example (example 3), eight imaging areas are used for collecting measurements in one die. For example, as shown in FIG. 5F, there may be provided imaging areas 540, 541, 542, 543, 544, 545, 546, and 547. Critical dimension metrology may be conducted by capturing images in four dies and averaging the measured values. Precision values can be obtained by performing a load/unload operation ten times and conducting ten runs of imaging. In each die, one frame of the same imaging area is imaged. Thus, a raw data point for each run may be represented by a single measurement value from one imaging area. In example 3, a primary beam current of 125 pA is used. Furthermore, since only one frame is taken, total electron dosage on respective imaging areas is reduced relative to examples 1 and 2. A critical dimension can be calculated as an average of $CD_1$ to $CD_8$, where $CD_1$ represents critical dimension measurements taken for a first image $CD_2$ represents critical dimension measurements taken for a second image, and so on. Measurement conditions are summarized in Table 1. Exemplary measurement data output is shown in the tables of FIG. 8.

Figure 8:
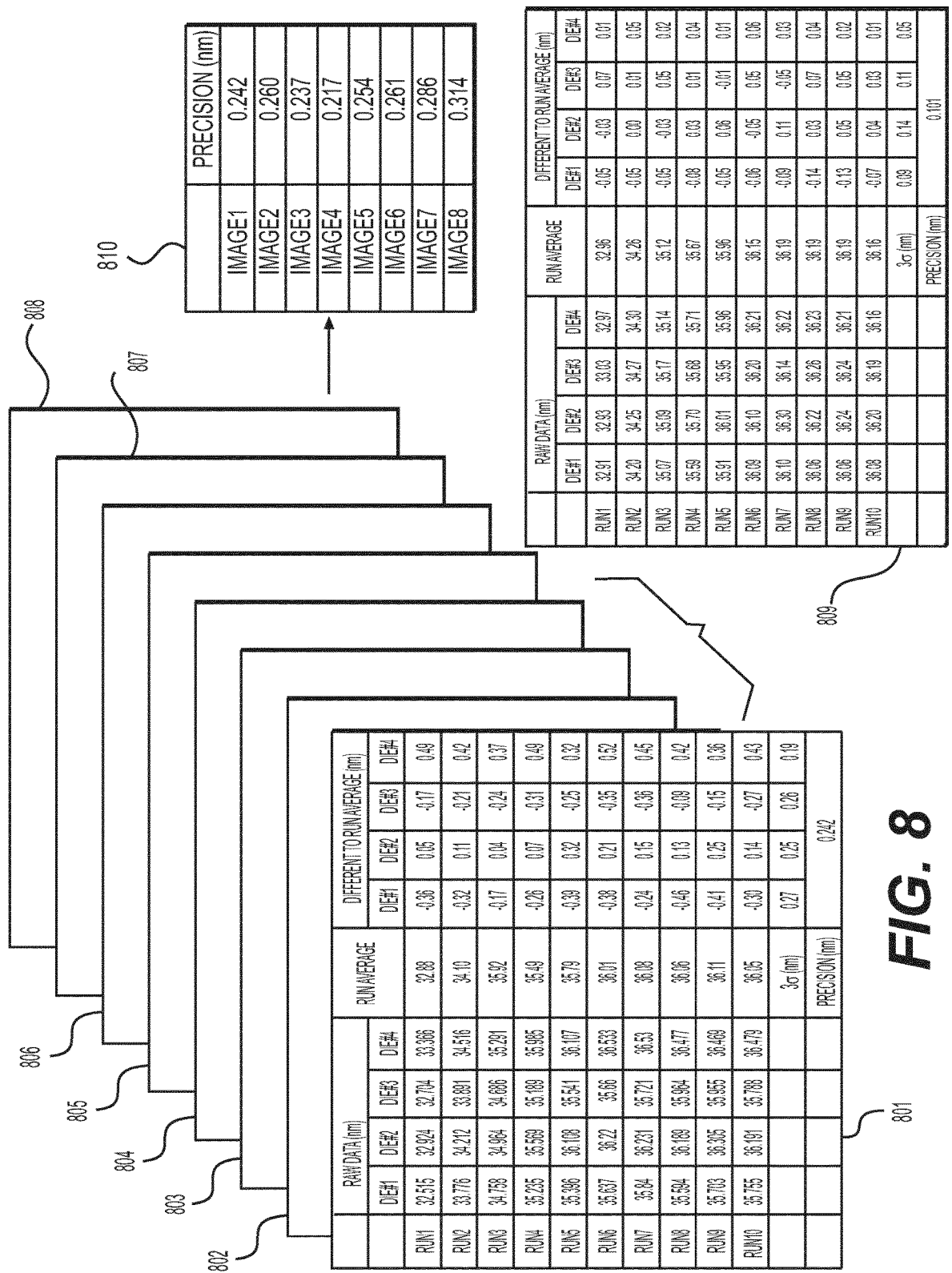
FIG. 8 shows tables of exemplary measurement data, consistent with embodiments of the present disclosure.

As shown in FIG. 8, there may be provided measurement data 801 corresponding to the first image, and measurement data 802 corresponding to the second image, and so on. While electron beam current is relatively high, each image is scanned only once, therefore, total electron dosage is less than that of examples 1 and 2. Image quality may be relatively degraded compared to examples 1 and 2. Furthermore, precision values in each of measurement data 801 through 808 may be larger than that of example 1. For example, chart 810 shows precision values obtained for each respective image. However, measurement data 801 through 808 can be combined to yield measurement data 809. Measurement data 809 comprises a plurality of data points each based on measurements from the eight images. In particular, measurement data 803 may comprise averaged raw data values. Each data point under the Raw Data (nm) heading of measurement data 809 may comprise an average of $CD_1$ through $CD_8$. For example, raw data entry for run 1, die #1 of measurement data 801 can be averaged with raw data entry for run 1, die #1 of measurement data 802, raw data entry for run 1, die #1 of measurement data 803, and so on through raw data entry for run 1, die #1 of measurement data 808. As a result, precision can be recovered. In the instance of example 3, precision of individual images may be 0.217 to 0.314 nm, as shown in chart 810. However, when averaged values of the eight images are used, precision of averaged CD of approximately 0.101 nm can be obtained.

In the above manner, dosage can be further reduced while the number of images per field is increased. Precision in individual images may degrade as dosage is reduced, however, precision can be recovered when using an averaged CD from multiple images under low dosage settings.

Furthermore, when using a plurality of different locations as test areas, flexibility can be afforded to position control patterns in various places on the wafer. For example, traditionally a control pattern is placed on the side of the wafer. However, when a small pattern is used that is repeated at a plurality of different locations on the wafer, more flexibility in design can be attained.

To collect low dosage images at different locations on a wafer, various inspection devices with varying fields of view (FOV) can be used. For example, a small FOV device can be used to capture individual images at different locations on the wafer by moving the sample stage.

In some embodiments, a large FOV device can be used to capture multiple imaging areas at different locations on the wafer without moving the sample stage. In some embodiments, a large FOV device may be, for example, a multibeam system. A large FOV device may also be, for example, a single-beam system configured to use beam deflection, as will be described later.

Figure 9B:
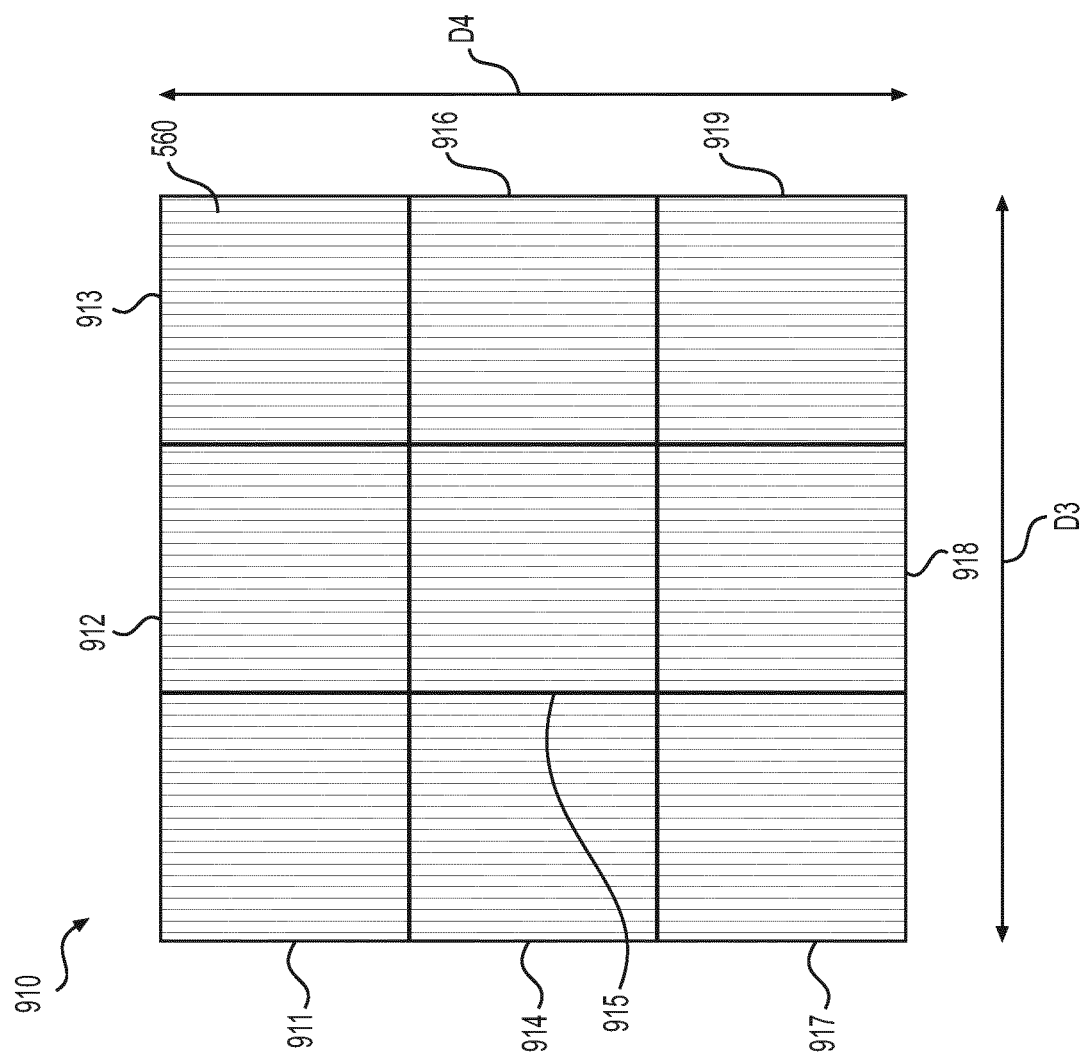
FIGS. 9A and 9B are diagrams illustrating exemplary acquired images, consistent with embodiments of the present disclosure.
Figure 9A:
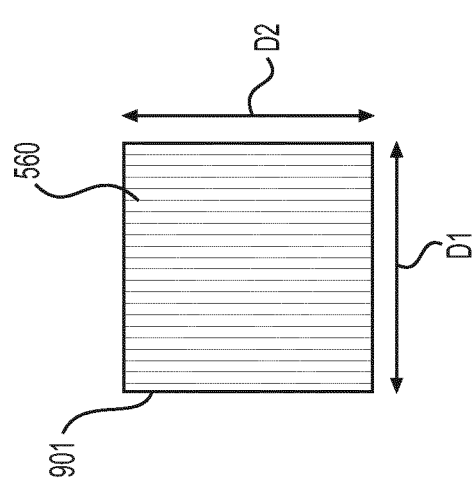

Reference is now made to FIGS. 9A and 9B, which illustrates exemplary scanned images. In FIG. 9A, a small FOV device may capture an image 901 having dimensions of D1 by D2. D1 and D2 may be, for example, 1 µm. Thus image 901 may be a size on the order of, for example, 1 µm×1 µm. Image 901 may correspond to an image used to represent an imaging area, for example, imaging area 540.

In FIG. 9B, a large FOV view device may capture an image 910 having dimensions of D3 by D4. D3 and D4 may be greater than D1 and D2. In some embodiments, image 910 may have a size on the order of, for example, 3 µm×3 µm. Image 910 comprises a plurality of sub-regions 911 through 919. Image 910 may be captured in a single frame. For example, in a scanning step, scanned raw data of an imaging signal can be saved as an original image and stored in a storage device. The original image may be divided into nine regions each having a size corresponding to D1 and D2. That is, each of the regions may have a size of, for example, 1 µm×1 µm. The scanned image can be compared to an original design of the wafer, such as GDS or OASIS designs and subdivided. Furthermore, division of the scanned image can be based on image processing, or other post-processing.

In some embodiments, when a large FOV device is used to capture an image, all imaging areas in a run can be captured concurrently without having to move a sample stage. For example, when the plurality of imaging areas 540 through 547 are to be acquired, a large FOV device can capture all eight imaging areas in one scanning step. Thus, processing throughput can be enhanced.

Additionally, while the above example discusses the use of eight imaging areas 540 through 547, the number of imaging areas is not so limited. For example, all nine sub-regions 911 through 919 can be used for conducting critical dimension metrology, and thus nine images can be used for measurement. Since measurement precision may be dependent on the number of times a value is measured, increasing the number of regions may further enhance precision.

In some embodiments, a large FOV device may be configured to capture a 12 µm FOV image. A 12 µm FOV image may have dimensions of approximately 3.464 µm×3.464 µm.

In a large FOV device, it is desirable for image distortion to be minimized. In critical dimension metrology, it may be desirable for image distortion to be less than 1%, and more preferably less than 0.1%. In some embodiments, image distortion within a 12 µm FOV image may be less than 0.1%.

Figure 10:
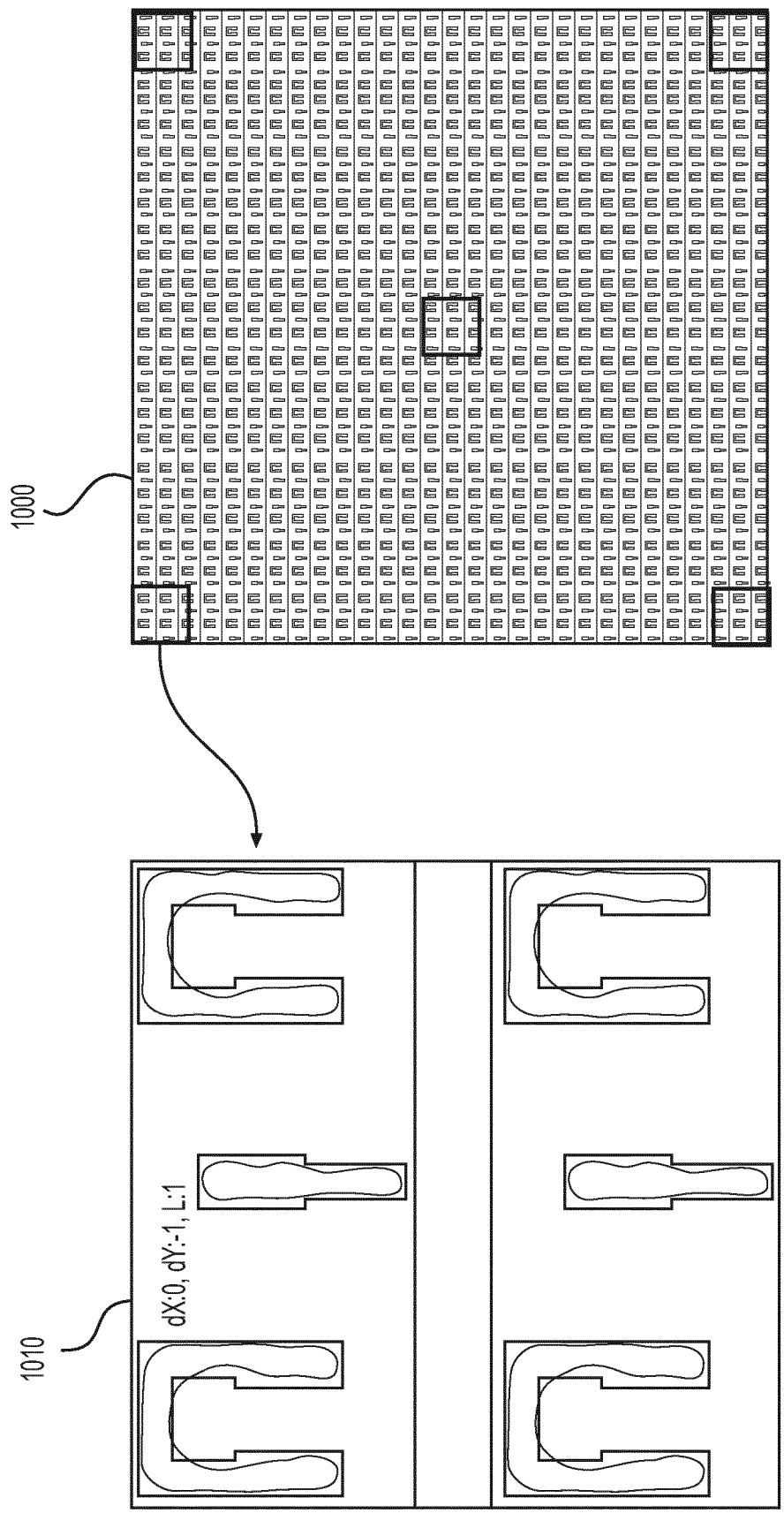
FIG. 10 illustrates an exemplary verification test of a two-dimensional pattern, consistent with embodiments of the present disclosure.

FIG. 10 shows an exemplary verification test of a two-dimensional pattern in a 12 µm FOV image. In a verification test, it is confirmed that an image does not undergo excessive distortion even in a large FOV device. For example, dimensions of a pattern are measured at critical regions, which may be a center of and four corners of an image. In FIG. 10, an image 1000 is captured and a pattern 1010, shown enlarged, is measured. Measurement of pattern 1010 may comprise superimposing outlines of observed shapes onto the image and determining attributes of outlines, such as length, location, separation, variation, etc.

In some embodiments, a total size of a captured image may be larger than an imaging area to be used for critical dimension metrology. Furthermore, a total size of a captured image may be larger than a group of all images to be used for critical dimension metrology. For example, while FIG. 9B shows a grid of nine regions that can be used as imaging areas, imaging areas can be spaced apart. Moreover, locations of imaging areas may be arbitrary.

Figure 11:
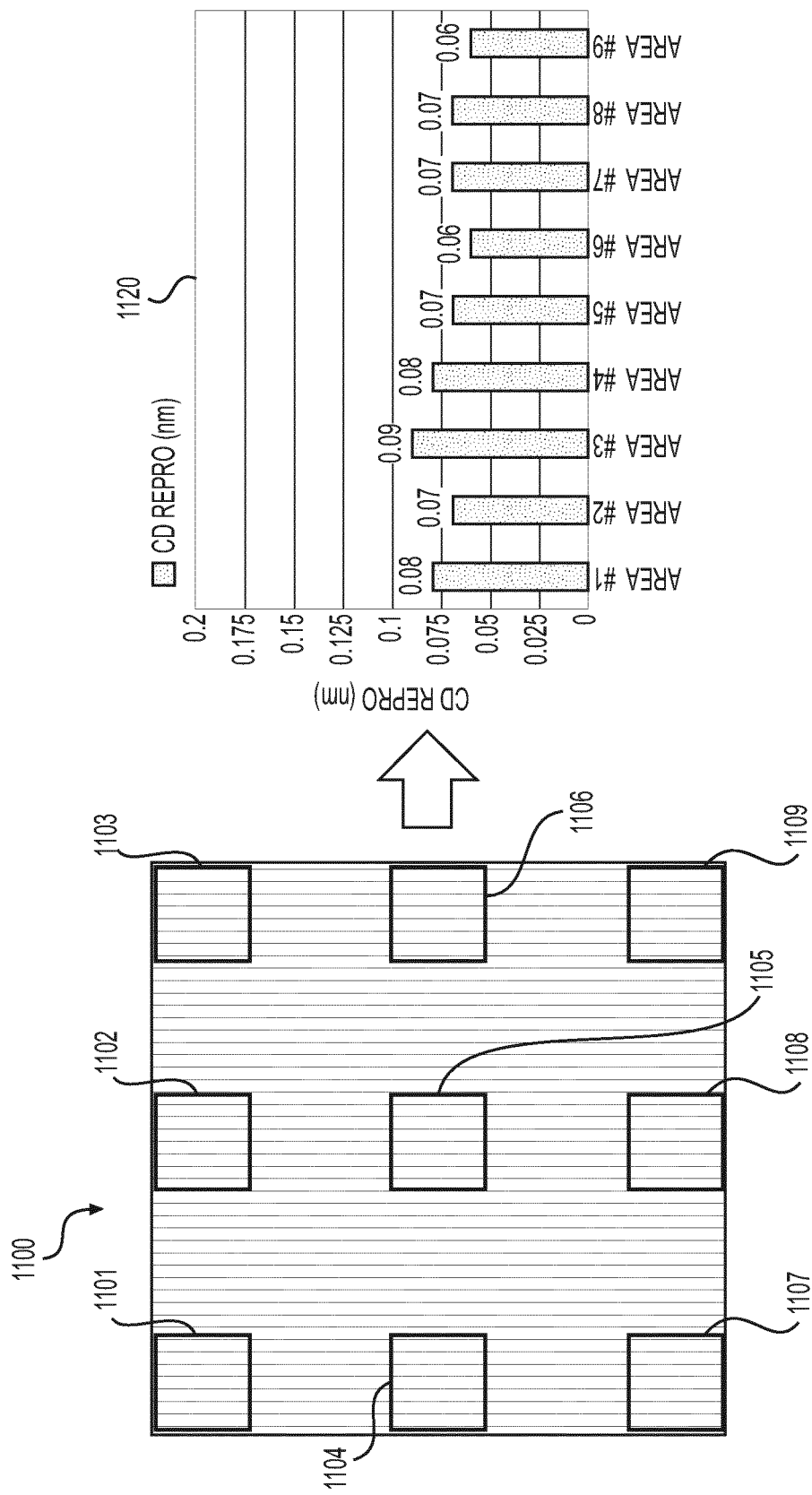
FIG. 11 illustrates an exemplary acquired image and a table of corresponding critical dimension reproducibility measurements, consistent with embodiments of the present disclosure.

FIG. 11 shows a large FOV image 1100 of a line pattern comprising a plurality of imaging regions 1101, 1102, 1103, 1104, 1105, 1106, 1107, 1108, and 1109. Imaging conditions may be, for example, 1000_0_23_250 pA, SEM8192, 1D4L1F. Critical dimension metrology may comprise imaging a 1K-image of each sub-image with 320 H-bars. Imaging region 1101 may be a sub-image corresponding to "Area #1" and so on. A chart 1120 shows that critical dimension reproduction for each of the imaging regions 1101 through 1109 may be less than 0.1 nm. Thus, in an image captured from a large FOV device, a plurality of imaging regions can be arbitrarily selected where CD reproduction can be obtained at suitable levels.

Figure 12A:
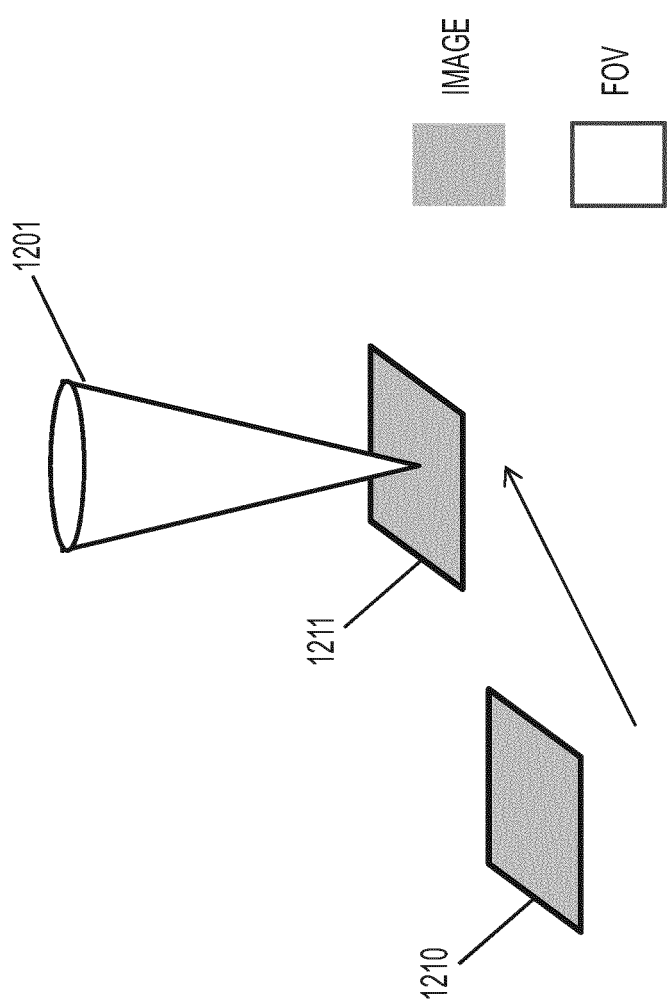
FIG. 12A is a diagram illustrating a stage moving method, consistent with embodiments of the present disclosure.

Image acquisition may comprise a stage moving method, a beam deflection method, and a combination thereof. For example, in a stage moving method, as illustrated in FIG. 12A, an electron beam tool may be configured to produce an inspection beam 1201 incident on a sample surface to be imaged. The inspection beam 1201 can be used for imaging by scanning the beam in a pattern (for example, a raster pattern) over the sample. Inspection beam 1201 may be configured to acquire an image of a first imaging area 1210 by scanning the beam over the surface of sample in the first imaging area 1210. Range of beam scanning may be limited by the FOV of the electron beam tool, and thus, the first imaging area 1210 may be coincident with the FOV. To image another area, the sample is moved by a sample stage and beam 1201 is scanned over a new area, for example imaging area 1211.

In the stage moving method, the stage moves for every image acquisition step. The image size may be limited to the FOV. Therefore, throughput may be represented by $n \times (t_{stage} + t_{image})$, where n is the number of images, $t_{stage}$ is the time required to move the sample stage, and $t_{image}$ is the time required to conduct imaging scanning.

Figure 12B:
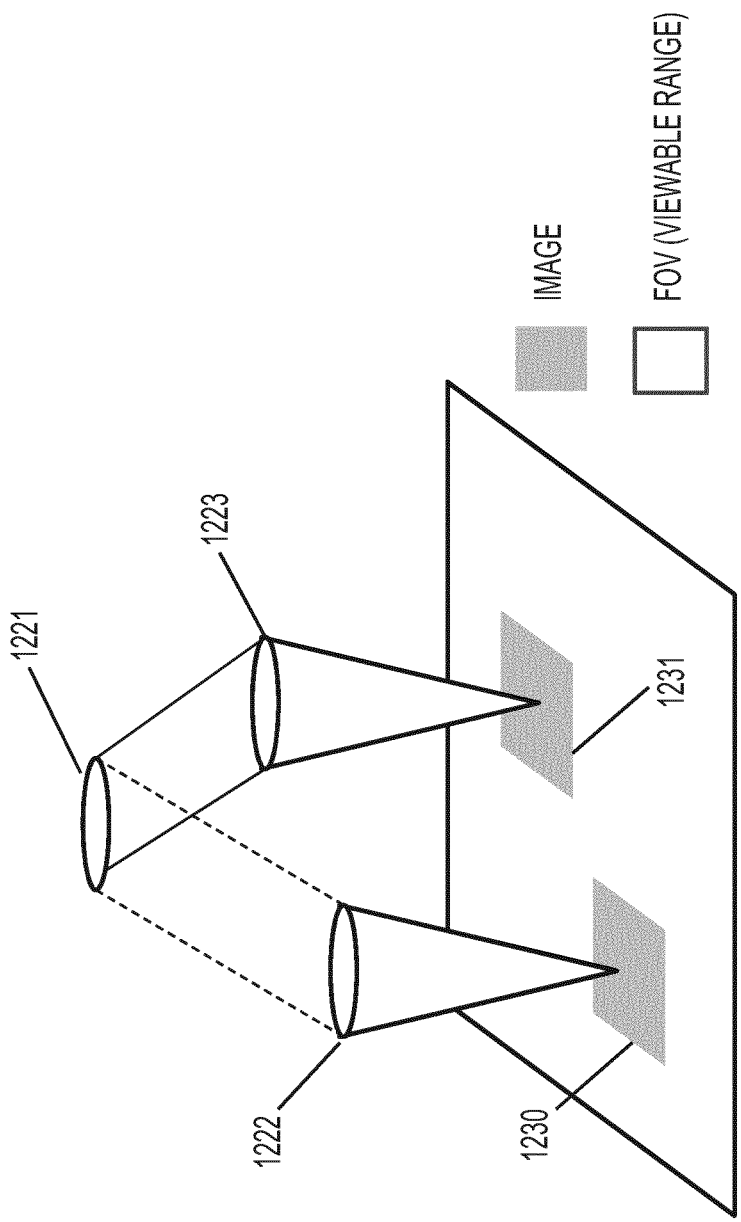
FIG. 12BA is a diagram illustrating a beam deflection method, consistent with embodiments of the present disclosure.

In a beam deflection method, multiple regions may be imaged without moving the sample stage. In the beam deflection method, an electron beam tool may be configured to provide a beam that can be deflected over various locations on a sample surface. An electron beam tool may comprise an electrostatic lens to bend a primary electron beam to focus the beam at various locations. For example, as illustrated in FIG. 12B, an electron beam tool may be configured to produce a beam 1221. Using beam deflection, an inspection beam 1222 can be provided at a first location to conduct imaging scanning at a first imaging area 1230. Beam 1221 can be deflected by the electron beam tool, and an inspection beam 1223 can also be provided at a second location to conduct imaging scanning at a second imaging area 1231. At each of the imaging locations, inspection beam 1221 or inspection beam 1223 can be used for imaging by scanning the beam in a pattern (for example, a raster pattern) over the sample. In the beam deflection method, the electron beam tool may be a large FOV device. Therefore, a plurality of imaging areas can be captured within the FOV, and the sample stage need not be moved. Moreover, multi-beam scanning may be performed to image multiple images concurrently.

In the beam deflection method, multiple image captures can be obtained per stage move. Furthermore, image and FOV sizes are independent. The sample stage may be moved to obtain images at other locations on a wafer. Throughput may be represented by $t_{stage} + n \times t_{image}$, where $t_{stage}$ is the time required to move the sample stage, n is the number of images, and $t_{image}$ is the time required to conduct imaging scanning. Throughput can be shortened relative to the stage moving method when beam deflection is employed.

Critical dimension metrology may comprise superimposing a plurality of indicators on a captured image, for example, H-markers. Depending on the type of feature to be analyzed, for example, leading-edge measurements, one-dimensional length measurements of a line-space pattern, distance between corners of traces, connection between traces, pattern pitch, etc., the type of indicator may be different. Image processing can be performed to superimpose the indicators on captured images. Moreover, contour stacking can be employed.

Reference is now made to FIG. 13, which illustrates an exemplary contour stacking procedure for two-dimensional features. For example, a contour can be drawn after image acquisition based on the image signal. The contour may correspond to observed features. The contour may be automatically generated based on attributes of the image signal, such as contrast. Critical dimension measurements may comprise, for example, a distance from tip to tip of adjacent lines, an edge-to-edge distance of parallel lines, line width, etc. Critical dimension measurements may be based on generated contours.

Reference is now made to FIG. 14, which illustrates an exemplary critical dimension metrology system 1400 according to an embodiment of the present disclosure. System 1400 may be used for inspecting a wafer 230 on a sample stage, and comprises an electron beam tool 104, as discussed above. System 1400 also comprises an image acquirer 1401, a storage 1402, and controller 109. Image acquirer 1401 may comprise a processor. For example, image acquirer 1401 may comprise a computer, server, mainframe host, terminals, personal computer, any kind of mobile computing devices, or a combination thereof. Image acquirer 1401 may connect with detector 244 through a medium such as an electrical conductor, optical fiber cable, portable storage media, IR, Bluetooth, internet, wireless network, wireless radio, or a combination thereof. Image acquirer 1401 may receive a signal from detector 244 and may construct an image. Image acquirer 1401 may thus acquire images of wafer 230. Image acquirer 1401 may also perform various post-processing functions, such as generating contours, superimposing indicators on an acquired image, and the like. Storage 1402 may be a storage medium such as a hard disk, random access memory (RAM), other types of computer readable memory, and the like. Storage 1402 is coupled with image acquirer 1401 and may be used for saving scanned raw image data as original images, and post-processed images. Image acquirer 1401 and storage 1402 are connected to controller 109.

Image averaging processing may be carried out through controller 109. For example, controller 109 may be configured to acquire a first plurality of measurements associated with a first feature of wafer 230. The first plurality of measurements may be critical dimension raw data of a pattern from a first imaging area on wafer 230. Controller 109 may be configured to acquire a second plurality of measurements associated with a second feature of wafer 230. The second plurality of measurement may be critical dimension raw data of a pattern from a second imaging area on wafer 230. The first feature and the second feature may be located at separate locations on wafer 230. For example, first imaging area and the second imaging area may be adjacent one another on wafer 230. The first imaging area and the second imaging area may also be spaced apart from one another. The first imaging area and the second imaging area can be configured such that they do not overlap. The second feature may be outside the FOV of the first imaging area where the first feature is located, or the first and second features may be within the same FOV of the charged electron beam tool 104.

In some embodiments, image acquirer 1401 may acquire one or more images of a sample based on an imaging signal received from detector 244. An imaging signal may correspond to a scanning operation for conducting charged particle imaging. An acquired image may be a single image comprising a plurality of imaging areas. The single image may be stored in storage 1402. The single image may be an original image that can be divided into a plurality of regions. Each of the regions may comprise one imaging area containing a feature of wafer 230.

Image averaging processing may comprise calculating a combined measurement based on the first plurality of measurements and the second plurality of measurements. The combined measurement may be an average. For example, each of the first plurality of measurements may be averaged with each of the second plurality of measurements, thus yielding a plurality of averaged valued. The plurality of averaged values can be used as critical dimension measurements. Accordingly, critical dimension metrology system 1400 can be used for process control of a semiconductor manufacturing process.

While controller 109, storage 1402, and image acquirer 1401 are depicted as separate units, a computer may carry out the processing of all of the units.

The embodiments may further be described using the following clauses:

1. A metrology system comprising:
a charged particle beam apparatus configured to generate a charged particle beam; and
a controller configured to:
acquire one or more images of a sample based on the charged particle beam, and store the one or more images in a storage;
acquire a first plurality of measurements associated with a first feature of the sample;
acquire a second plurality of measurements associated with a second feature of the sample, the second feature being at a separate location on the sample from the first feature; and
determine a combined measurement based on the first plurality of measurements and the second plurality of measurements.

2. The system of clause 1, wherein the first feature and the second feature are identical.

3. The system of any one of clauses 1 and 2, wherein the combined measurement is a critical dimension of the first feature and the second feature.

4. The system of any one of clauses 1 through 3, wherein precision of the combined measurement is less than or equal to 0.1 nm.

5. The system of any one of clauses 1 through 4, wherein the combined measurement comprises averaged values of each of the first plurality of measurements with each of the second plurality of measurements.

6. The system of any one of clauses 1 through 5, wherein the controller is configured to acquire the one or more images without moving a sample stage holding the sample.

7. The system of any one of clauses 1 through 6, wherein the charged particle beam is set to a current of less than or equal to 250 pA.

8. The system of any one of clauses 1 through 7, wherein the one or more images comprise a plurality of images separately stored in the storage, a first image of the plurality of images comprising the first feature, and a second image of the plurality of images comprising the second feature.

9. The system of any one of clauses 1 through 7, wherein the one or more images is a single image stored in the storage, and the controller is configured to divide the single image into a plurality of regions, a first region of the plurality of regions comprising the first feature and a second region of the plurality of regions comprising the second feature.

10. The system of any one of clauses 1 through 9, wherein a number of frames of the one or more images is less than or equal to four.

11. The system of any one of clauses 1 through 9, wherein a number of frames of the one or more images is less than or equal to two.

12. The system of any one of clauses 1 through 9, wherein a number of frames of the one or more images is one.

13. A metrology method comprising:
generating a charged particle beam;
generating a first imaging signal by irradiating a first imaging area of a sample with the charged particle beam;
generating a second imaging signal by irradiating a second imaging area of the sample with the charged particle beam, the second imaging area being at a separate location on the sample from the first feature;
acquiring a plurality of measurements associated with a first feature in the first imaging area;
acquiring a plurality of measurements associated with a second feature in the second imaging area; and
determining a combined measurement based on the first plurality of measurements and the second plurality of measurements.

14. The method of clause 13, wherein the first feature and the second feature are identical.

15. The method of any one of clauses 13 and 14, wherein the combined measurement is a critical dimension of the first feature and the second feature.

16. The method of any one of clauses 13 through 15, wherein precision of the combined measurement is less than or equal to 0.1 nm.

17. The method of any one of clauses 13 through 16, wherein the combined measurement comprises averaged values of each of the first plurality of measurements with each of the second plurality of measurements.

18. The method of any one of clauses 13 through 17, wherein the first imaging signal and the second imaging signal are generated without moving a sample stage holding the sample.

19. The method of any one of clauses 13 through 18, wherein the charged particle beam is set to a current of less than or equal to 250 pA.

20. The method of any one of clauses 13 through 19, further comprising separately storing a plurality of images in a storage, a first image of the plurality of images comprising the first feature and a second image of the plurality of images comprising the second feature.

21. The method of any one of clauses 13 through 19, further comprising
storing a single image in a storage, the single image comprising the first feature and the second feature; and
dividing the single image into a plurality of regions, a first region of the plurality of regions comprising the first feature and a second region of the plurality of regions comprising the second feature.

22. The method of clause 20, wherein a number of frames of the plurality of images is less than or equal to four.

23. The method of clause 20, wherein a number of frames of the plurality of images is less than or equal to two.

24. The method of clause 20, wherein a number of frames of the plurality of images is one.

25. The method of clause 21, wherein a number of frames of the plurality of images is less than or equal to four.

26. The method of clause 21, wherein a number of frames of the plurality of images is less than or equal to two.

27. The method of clause 21, wherein a number of frames of the plurality of images is one.

28. A non-transitory computer readable medium comprising a set of instructions that are executable by one or more processors of an apparatus to cause the apparatus to perform a method comprising:
generating a charged particle beam;
generating a first imaging signal by irradiating a first imaging area of a sample with the charged particle beam;
generating a second imaging signal by irradiating a second imaging area of the sample with the charged particle beam, the second imaging area being at a separate location on the sample from the first feature;
acquiring a plurality of measurements associated with a first feature in the first imaging area;
acquiring a plurality of measurements associated with a second feature in the second imaging area; and
determining a combined measurement based on the first plurality of measurements and the second plurality of measurements.

29. The computer readable medium of clause 28, wherein the first feature and the second feature are identical.

30. The computer readable medium of any one of clauses 28 and 29, wherein the combined measurement is a critical dimension of the first feature and the second feature.

31. The computer readable medium of any one of clauses 28 through 30, wherein precision of the combined measurement is less than or equal to 0.1 nm.

32. The computer readable medium of any one of clauses 28 through 31, wherein the combined measurement comprises averaged values of each of the first plurality of measurements with each of the second plurality of measurements.

33. The computer readable medium of any one of clauses 28 through 32, wherein the first imaging signal and the second imaging signal are generated without moving a sample stage holding the sample.

34. The computer readable medium of any one of clauses 28 through 33, wherein the charged particle beam is set to a current of less than or equal to 250 pA.

35. The computer readable medium of any one of clauses 28 through 34, wherein the set of instructions that are executable by one or more processors of the apparatus cause the apparatus to further perform:
separately storing a plurality of images in a storage, a first image of the plurality of images comprising the first feature and a second image of the plurality of images comprising the second feature.

36. The computer readable medium of any one of clauses 28 through 34, wherein the set of instructions that are executable by one or more processors of the apparatus cause the apparatus to further perform:
storing a single image in a storage, the single image comprising the first feature and the second feature; and
dividing the single image into a plurality of regions, a first region of the plurality of regions comprising the first feature and a second region of the plurality of regions comprising the second feature.

37. The computer readable medium of clause 35, wherein a number of frames of the plurality of images is less than or equal to four.

38. The computer readable medium of clause 35, wherein a number of frames of the plurality of images is less than or equal to two.

39. The computer readable medium of clause 35, wherein a number of frames of the plurality of images is one.

40. The computer readable medium of clause 36, wherein a number of frames of the plurality of images is less than or equal to four.

41. The computer readable medium of clause 36, wherein a number of frames of the plurality of images is less than or equal to two.

42. The computer readable medium of clause 36, wherein a number of frames of the plurality of images is one.

A non-transitory computer readable medium may be provided that stores instructions for a processor of the controller 109 to carry out the image averaging processing. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

While examples have been discussed with reference to electron sensitive materials, aspects of the present disclosure may also be applied to other types of materials. For example, AEI patterns, SEM calibration standards, and tin spheres can also be imaged. For example, in exemplary aspects of the present disclosure, high resolution and high SNR can be obtained while still providing fast throughput.

In addition, while precision measurements are discussed in terms of reproducibility, aspects of the present disclosure may also be applied to long term stability measurements. For example, in long term stability measurement, data collection may comprise ten load/unload cycles performed at a rate of one cycle per day. That is, each run takes place at an interval of one day. Precision values can thus be measured to be $3\sigma$ of 10 day measured CD. RMS of all field precision values can be taken for an overall long-term precision. According to aspects of the present disclosure, long term precision of, for example, 0.06 nm can be obtained.

It will be appreciated that the present invention is not limited to the exact construction that has been described above and illustrated in the accompanying drawings, and that various modifications and changes can be made without departing from the scope thereof. For example, while some examples discuss the use of four dies of a wafer, the number of dies selected to be used in image averaging processing can be any number. Furthermore, the dies need not necessarily be adjoining.

It is intended that the scope of the invention should only be limited by the appended claims.

The invention claimed is:

1. A metrology system comprising:
a charged particle beam apparatus configured to generate a charged particle beam; and a controller configured to:
acquire one or more images of a sample based on the charged particle beam and store the one or more images in a storage;
acquire a first plurality of measurements associated with a first instance of a feature of the sample;
acquire a second plurality of measurements associated with a second instance of the feature of the sample, the second instance being at a separate location on the sample from the first instance; and
determine a combined measurement representing a parameter of the feature based on the first plurality of measurements and the second plurality of measurements.

2. The system of claim 1, wherein the first instance and the second instance are identical.

3. The system of claim 1, wherein the combined measurement is a critical dimension of the feature.

4. The system of claim 1, wherein precision of the combined measurement is less than or equal to 0.1 nm.

5. The system of claim 1, wherein the combined measurement comprises averaged values of each of the first plurality of measurements with each of the second plurality of measurements.

6. The system of claim 1, wherein the one or more images comprise a plurality of images, and the controller is configured to acquire the one or more images without moving a sample stage holding the sample.

7. The system of claim 1, wherein the charged particle beam is set to a current of less than or equal to 250 pA.

8. The system of claim 1, wherein the one or more images comprise a plurality of images separately stored in the storage, a first image of the plurality of images comprising the first instance, and a second image of the plurality of images comprising the second instance.

9. The system of claim 1, wherein the one or more images is a single image stored in the storage, and the controller is configured to divide the single image into a plurality of regions, a first region of the plurality of regions comprising the first instance and a second region of the plurality of regions comprising the second instance.

10. The system of claim 1, wherein a number of frames of the one or more images is less than or equal to four.

11. The system of claim 1, wherein a number of frames of the one or more images is less than or equal to two.

12. The system of claim 1, wherein a number of frames of the one or more images is one.

13. The system of claim 1, further comprising a deflector configured to deflect the charged particle beam from a first imaging area at the first instance to a second imaging area at the second instance without moving a sample stage holding the sample.

14. A metrology method comprising:
generating a charged particle beam;
generating a first imaging signal by irradiating a first imaging area of a sample with the charged particle beam;
generating a second imaging signal by irradiating a second imaging area of the sample with the charged particle beam, the second imaging area being at a separate location on the sample from the first imaging area;
acquiring a plurality of measurements associated with a first instance of a feature in the first imaging area;
acquiring a plurality of measurements associated with a second instance of the feature in the second imaging area; and
determining a combined measurement representing a parameter of the feature based on the first plurality of measurements and the second plurality of measurements.

15. The method of claim 14, wherein the first instance and the second instance are identical, wherein the combined measurement is a critical dimension of the feature, and wherein the combined measurement comprises averaged values of each of the first plurality of measurements with each of the second plurality of measurements.

16. A non-transitory computer readable medium comprising a set of instructions that are executable by one or more processors of an apparatus to cause the apparatus to perform a method comprising:
- generating a charged particle beam;
- generating a first imaging signal by irradiating a first imaging area of a sample with the charged particle beam;
- generating a second imaging signal by irradiating a second imaging area of the sample with the charged particle beam, the second imaging area being at a separate location on the sample from the first imaging area;
- acquiring a plurality of measurements associated with a first instance of a feature in the first imaging area;
- acquiring a plurality of measurements associated with a second instance of the feature in the second imaging area; and
- determining a combined measurement representing a parameter of the feature based on the first plurality of measurements and the second plurality of measurements.

17. The method of claim 14, wherein the first imaging region and the second imaging region are located within the same field of view of a charged particle beam tool generating the charged particle beam.

18. A metrology system comprising:
- a charged particle beam apparatus configured to generate a charged particle beam; and a controller configured to:
- acquire one or more images of a sample based on the charged particle beam and store the one or more images in a storage;
- acquire a first plurality of measurements associated with a first feature of the sample;
- acquire a second plurality of measurements associated with a second feature of the sample, the second feature being at a separate location on the sample from the first feature; and
- determine a combined measurement based on the first plurality of measurements and the second plurality of measurements,
- wherein precision of the combined measurement is less than or equal to 0.1 nm.

19. A metrology system comprising:
- a charged particle beam apparatus configured to generate a charged particle beam; and a controller configured to:
- acquire one or more images of a sample based on the charged particle beam and store the one or more images in a storage;
- acquire a first plurality of measurements associated with a first feature of the sample;
- acquire a second plurality of measurements associated with a second feature of the sample, the second feature being at a separate location on the sample from the first feature; and
- determine a combined measurement based on the first plurality of measurements and the second plurality of measurements,
- wherein the charged particle beam is set to a current of less than or equal to 250 pA.

* * * * *